(12) United States Patent
Karlsson et al.

(10) Patent No.: US 11,190,028 B2
(45) Date of Patent: Nov. 30, 2021

(54) CIRCUITRY AND APPARATUSES FOR MONITORING AND CONTROLLING A BATTERY AND CONFIGURABLE BATTERIES

(71) Applicants: Christer Karlsson, Linköping (SE);
Per Broms, Linköping (SE)

(72) Inventors: Christer Karlsson, Linköping (SE);
Per Broms, Linköping (SE)

(73) Assignee: Ensurge Micropower ASA, Oslo (NO)

( * ) Notice: Subject to any disclaimer, the term of this patent is extended or adjusted under 35 U.S.C. 154(b) by 180 days.

(21) Appl. No.: 16/543,432

(22) Filed: Aug. 16, 2019

(65) Prior Publication Data
US 2020/0059106 A1  Feb. 20, 2020

Related U.S. Application Data

(60) Provisional application No. 62/765,126, filed on Aug. 16, 2018.

(51) Int. Cl.
| | |
|---|---|
| *H02J 7/00* | (2006.01) |
| *B60L 58/22* | (2019.01) |
| *H01M 10/48* | (2006.01) |
| *H01M 10/0525* | (2010.01) |
| *G01R 31/396* | (2019.01) |

(52) U.S. Cl.
CPC ............ *H02J 7/0014* (2013.01); *B60L 58/22* (2019.02); *H01M 10/482* (2013.01); *H01M 10/486* (2013.01); *H02J 7/007* (2013.01); *G01R 31/396* (2019.01); *H01M 10/0525* (2013.01)

(58) Field of Classification Search
CPC ............ H02J 7/00; B60L 58/22; H01M 10/48
USPC .......................................................... 320/116
See application file for complete search history.

(56) References Cited

U.S. PATENT DOCUMENTS

| | | | | |
|---|---|---|---|---|
| 7,038,463 | B2 * | 5/2006 | Cooper et al. ......... | A63H 30/04 324/538 |
| 7,598,706 | B2 * | 10/2009 | Koski et al. ........ | H01M 10/441 320/117 |

(Continued)

OTHER PUBLICATIONS

Qi et al.,"Review of Battery Cell Balancing Techniques", Sep. 2014, IEEE, Australasian Universities Power Engineering Conference (AUPEC), Technical Report pp. 1-6.*

*Primary Examiner* — Sun J Lin
(74) *Attorney, Agent, or Firm* — Andrew D. Fortney; Central California IP Group, P.C.

(57) ABSTRACT

A battery management system having configurable batteries is disclosed. The battery management system generally includes (a) one or more cell control units, each cell control unit configured to control and/or balance a charge in a plurality of battery cells, and (b) a master controller in electrical communication with cell control unit(s). The cell control unit(s) as a whole include one or more switches, configured to be electrically connected to a first battery cell of a plurality of battery cells, and a resistor, a capacitor or an inductor electrically (i) connected to one switch and (ii) connected or connectable to a second battery cell. The master controller is configured to open or close each switch. The configurable battery generally includes a plurality of battery cells and switches configured to connect or disconnect the plurality of battery cells in a configurable or predetermined manner.

20 Claims, 22 Drawing Sheets

(56) References Cited

U.S. PATENT DOCUMENTS

| | | | | |
|---|---|---|---|---|
| 7,990,101 | B2* | 8/2011 | Hoff et al. | H01M 10/425 |
| | | | | 320/107 |
| 9,472,961 | B2* | 10/2016 | De Cock | H02J 7/0019 |
| 9,806,318 | B2* | 10/2017 | Holtappels et al. | H01M 50/20 |
| 9,893,385 | B1* | 2/2018 | Nayar et al. | H01M 10/486 |
| 10,770,908 | B2* | 9/2020 | Verbridge | B60L 53/11 |
| 2008/0180061 | A1* | 7/2008 | Koski et al. | H02J 7/0024 |
| | | | | 320/117 |
| 2009/0085553 | A1* | 4/2009 | Kumar et al. | H02J 7/0024 |
| | | | | 323/351 |
| 2018/0138555 | A1* | 5/2018 | Knight | H01M 10/482 |

\* cited by examiner (RELATED ART)

FIG. 10A
FIG. 10B
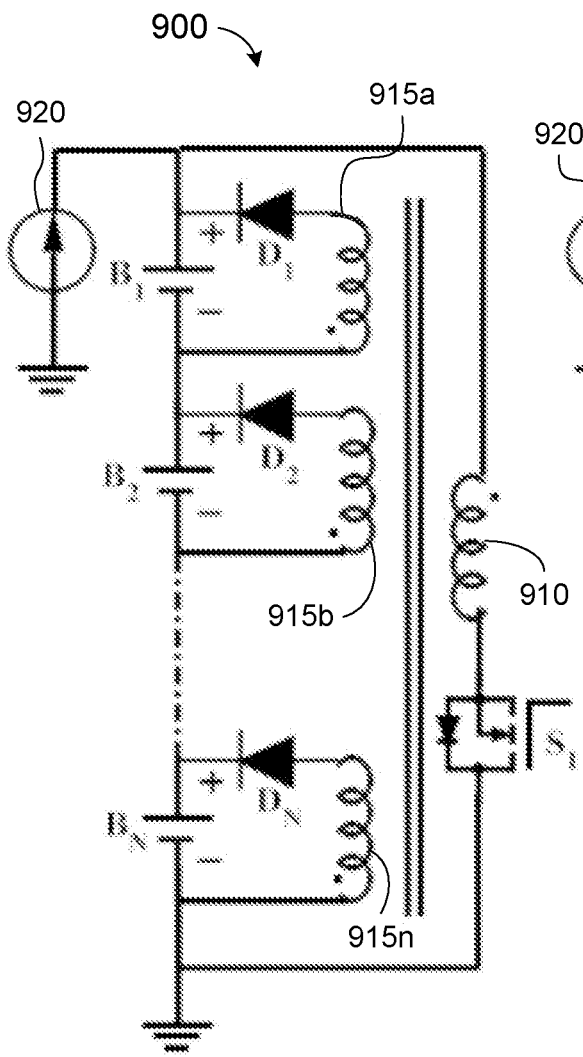
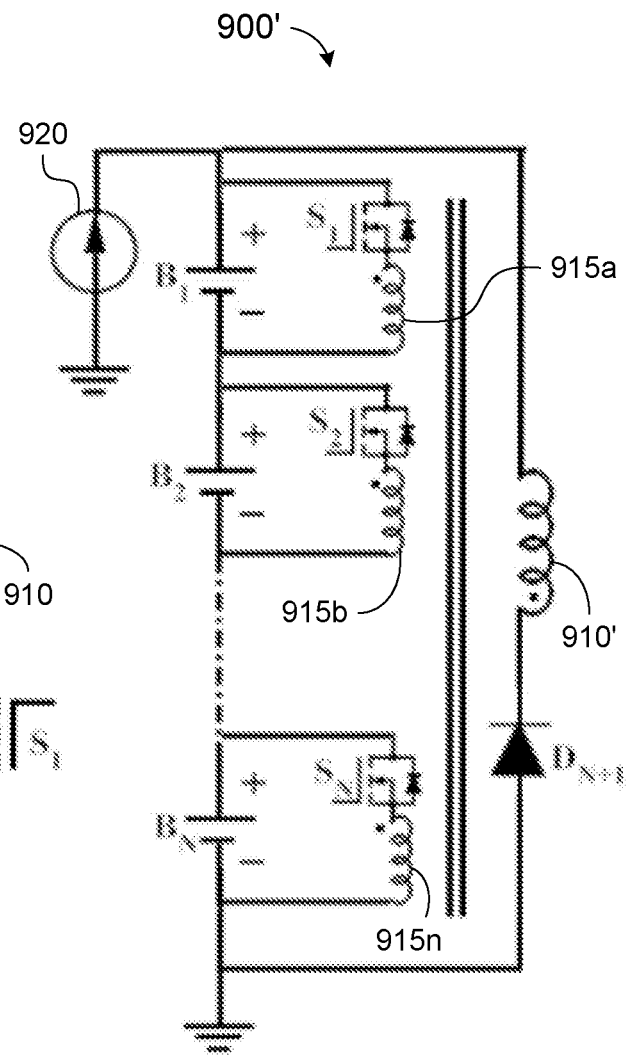

CIRCUITRY AND APPARATUSES FOR MONITORING AND CONTROLLING A BATTERY AND CONFIGURABLE BATTERIES

RELATED APPLICATION(S)

The present application claims priority to U.S. Provisional Pat. Appl. No. 62/765,126, filed Aug. 16, 2018, incorporated herein by reference in its entirety.

FIELD OF THE INVENTION

The present invention generally relates to the field of thin film integrated circuits and apparatuses for monitoring and/or controlling a battery. More specifically, embodiments of the present invention pertain to printed and/or thin film integrated circuits (PICs) configured that include films and/or structures made from a liquid-phase source of silicon, and methods for making and using the same.

DISCUSSION OF THE BACKGROUND

Currently, in multiple-cell battery systems such as those used in electric vehicles (EVs) and hybrid electric vehicles (HEVs), there is a need for cell balancing in order to avoid overstressing any of the cells in the system and to prolong the lifetime of the battery. It is important to avoid overstressing the cells during both charging and discharging, although the detrimental effects have different origins for charging vs. discharging.

Battery management systems (BMSs) have been developed to monitor and manage charging and discharging cells (individually and as a group) in a multi-cell battery. BMSs have been implemented in a number of different topologies. For example, FIG. 1A shows a distributed topology. In a distributed topology, slave units 10a-f including a voltage monitor and a discharge balancer is placed on each cell in the battery 20. The slave units 10a-f communicate digitally with the master controller 30 and the corresponding cell in the battery 20, and can cut off the cell charger and report the cell's status. The advantages of the topology of FIG. 1A include simplicity and high reliability. The disadvantages include the large number of slave units 10a-f (each on its own printed circuit board [PCB]) and the difficulty of mounting the PCBs on certain types of cells.

FIG. 1B shows a modular topology, in which slave controllers 140 and 145 are used to monitor and manage subsets of cells 110 and 115, and consolidate the data to a master controller 130. A PCB may not be necessary to connect individual cells controlled by a common slave. However, isolated master-slave communications can be challenging when this topology is used in an electric vehicle.

FIG. 1C shows a centralized topology 150, in which a centralized master control unit 160 is directly connected to each cell of the battery pack 170. The control unit 160 protects and balances all cells while providing various other functions. However, excess heat may be generated because the controller 160 is the only functional unit for cell balancing. In addition, the cells may be distributed among various disparate locations in the vehicle, which requires wiring from the various cells to a central location.

The various topologies are commonly implemented using conventional electronics and a remote PCB, with many cables going between the PCB and the cells. For cost and other practical reasons, conventional BMSs often employ the modular topography (in which each module corresponds to, e.g., 6-8 cells). Balancing of cell performance in this topology results in a longer operational life-time of the battery. However, BMSs with conventional electronics are relatively bulky and are typically implemented only as a multi-cell module (e.g., 8-20 cells forming a 24V or 48V module). There is a need for a solution that can adjust or correct for defective battery cells, as well as for greater distribution of the electronic components to improve and/or optimize heat management relative to conventional systems.

This "Discussion of the Background" section is provided for background information only. The statements in this "Discussion of the Background" are not an admission that the subject matter disclosed in this "Discussion of the Background" section constitutes prior art to the present disclosure, and no part of this "Discussion of the Background" section may be used as an admission that any part of this application, including this "Discussion of the Background" section, constitutes prior art to the present disclosure.

SUMMARY OF THE INVENTION

The present invention advantageously solves or can solve a number of problems. For example, it provides affordable and/or cost-effective balancing of performance and/or output among the cells of the battery. It can manage individual battery cells, resulting in a longer operational life-time of the battery compared to conventional BMSs. The use of relatively low-cost printed doped polysilicon (PDPS) technology advantageously allows each cell to be monitored and connect/disconnected individually and the battery to include redundant cells (which also increases operational lifetime). The present invention also improves and/or optimizes heat management by distributing the monitoring and control electronics more effectively than conventional BMSs.

These and other advantages of the present invention will become readily apparent from the detailed description of various embodiments below.

BRIEF DESCRIPTION OF THE DRAWINGS

FIGS. 10A-B and 11 are diagrams showing exemplary multi-winding transformer (MWT) balancing topologies according to embodiments of the present invention.

DETAILED DESCRIPTION

Figure 1A:
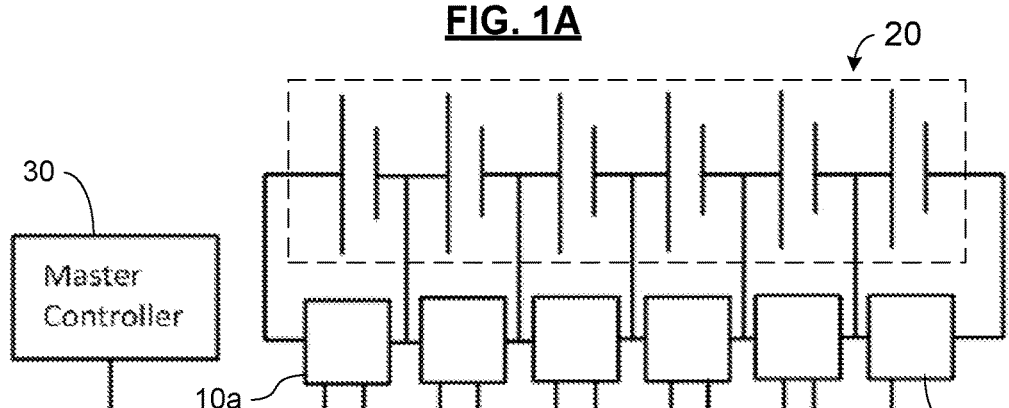
FIGS. 1A-C are diagrams showing various topologies for battery management systems (BMSs).

Reference will now be made in detail to various embodiments of the invention, examples of which are illustrated in the accompanying drawings. While the invention will be described in conjunction with the following embodiments, it will be understood that the descriptions are not intended to limit the invention to these embodiments. On the contrary, the invention is intended to cover alternatives, modifications and equivalents that may be included within the spirit and scope of the invention as defined by the appended claims. Furthermore, in the following detailed description, numerous specific details are set forth in order to provide a thorough understanding of the present invention. However, it will be readily apparent to one skilled in the art that the present invention may be practiced without these specific details. In other instances, well-known methods, procedures, components, and circuits have not been described in detail so as not to unnecessarily obscure aspects of the present invention.

The technical proposal(s) of embodiments of the present invention will be fully and clearly described in conjunction with the drawings in the following embodiments. It will be understood that the descriptions are not intended to limit the invention to these embodiments. Based on the described embodiments of the present invention, other embodiments can be obtained by one skilled in the art without creative contribution and are in the scope of legal protection given to the present invention.

Furthermore, all characteristics, measures or processes disclosed in this document, except characteristics and/or processes that are mutually exclusive, can be combined in any manner and in any combination possible. Any characteristic disclosed in the present specification, claims, Abstract and Figures can be replaced by other equivalent characteristics or characteristics with similar objectives, purposes and/or functions, unless specified otherwise.

For the sake of convenience and simplicity, the terms "integrated circuit," "printed integrated circuit," "printed and/or thin film integrated circuit," and "PIC" are generally used interchangeably herein, but are generally given their art-recognized meanings. A "printed integrated circuit" is an integrated circuit on a single substrate that includes one or more printed layers of material, and in which any layers that are not printed may be formed by thin film processing. Also, for convenience and simplicity, the terms "connected to," "coupled with," "coupled to," and "in communication with," which connections, couplings and communications include direct and indirect connections, couplings and communications unless the context unambiguously indicates otherwise, but these terms are also generally given their art-recognized meanings.

Use of PDPS or other silicon-based technology on a thin, flexible substrate to integrate onto each cell in the battery the monitoring and control electronics for the cell adds only a very small additional thickness to the cell. This approach will also reduce the number of cables in the battery module. By adding monitoring and control circuitry and active and/or passive balancing circuitry close to the cell, it is possible to eliminate the first layer of the more expensive DC/DC converter, as well as other electronics. The cost of the contact pads and pins associated with conventional electronics increases the cost of individual cell monitoring and balancing. The relatively low-cost pads associated with PDPS technology allows more cost-efficient solutions to cell monitoring and/or balancing than conventional electronics. Reduction of costs, complexity in assembly processing, and the space and/or area of the control electronics and cables results in a smaller, lighter, more affordable and possibly higher yielding battery management system and method that also increases the battery lifetime.

Making PDPS structures from a liquid-phase polysilane and/or cyclosilane ink and a printed dopant ink allows integration of electronic structures and/or devices (e.g., transistors, resistors, capacitors, diodes, etc.) onto flexible substrates that are quite useful for locating battery management units directly on or adjacent to battery cells. Furthermore, the large area of printed integrated circuits (PICs) makes the manufacture of PICs compatible with roll-to-roll (R2R) processing, which can also be used to make PICs on flexible PCBs and for assembling antennas (e.g., for wireless communications) with the PICs. This enables the use of thin film and printing processes to make a flexible IC (e.g., a flexible PIC), a result and manufacturing method that is not viable with conventional monolithic Si processing.

The invention, in its various aspects, will be explained in greater detail below with regard to exemplary embodiments.

PDPS- or other silicon-based circuitry can be designed and used to monitor properties of each individual cell and control individual cell balancing. The data (e.g., voltage, temperature, current, etc.) collected by the control and/or monitoring circuits is communicated to other control and/or monitoring circuits and/or to a central battery management system (BMS) via a bi-directional communication interface.

Figure 2:
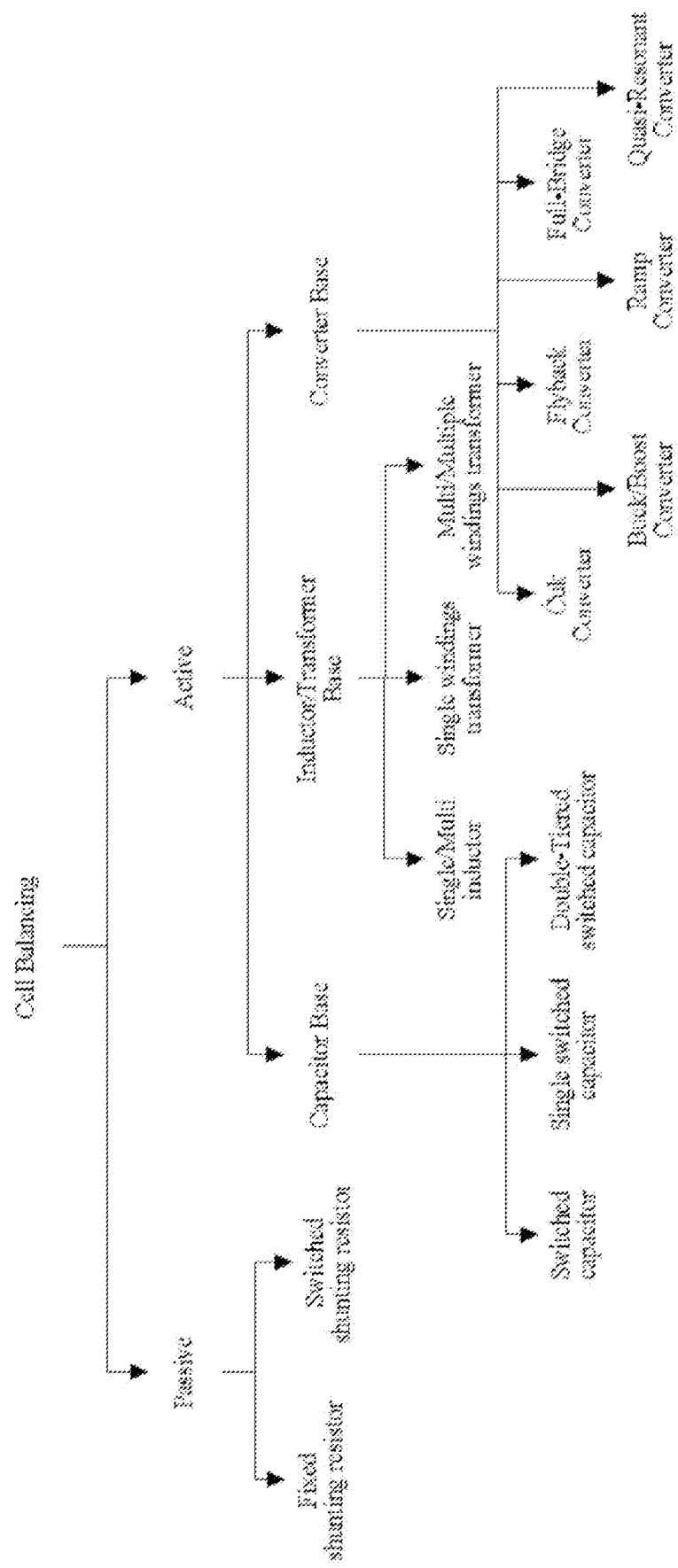
FIG. 2 is a diagram showing various passive and active cell balancing topologies and certain relationships among them.

The present BMS includes one or more circuits comprising transistors and optionally resistors, capacitors, diodes and/or inductors including PDPS or other elemental silicon-containing structures. The circuit(s) are configured to monitor individual cell voltage and temperature, and may be combined with a passive or active balancing circuit for every battery cell. FIG. 2 shows a scheme for various passive and active cell balancing topologies, all of which can be used in the present invention. Voltage and temperature data are sent from individual cells via the communication interface (e.g., a serial bus) to the central BMS. The BMS determines which cell(s) should be adjusted (e.g., subjected to balancing) in response to the voltage information and sends a corresponding command and/or corresponding information via the communication interface to the balancing circuit in the cell(s) to be adjusted. When the temperature of a cell or module exceeds a predetermined threshold, the BMS can send a control signal to turn off the balancing circuit in the cell(s) having a temperature exceeding the threshold, until the temperature of the cell(s) falls below the threshold.

Figure 3:
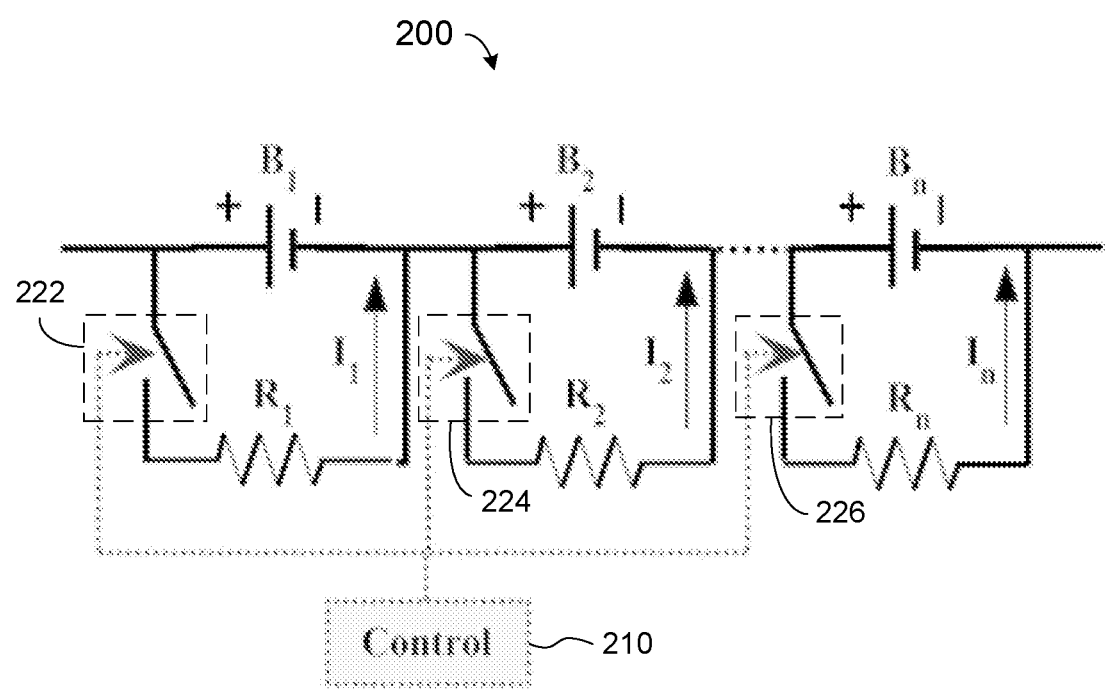
FIG. 3 is a diagram showing an exemplary control and/or balancing circuit for a battery or battery module according to embodiments of the present invention.

For example, FIG. 3 shows a partial battery or battery module 200 comprising a plurality of cells $B_1$-$B_n$ and a passive switched resistor cell balancing control system. Each cell $B_1$-$B_n$ is accompanied by (i) a corresponding resistor $R_1$-$R_n$ in parallel with the cell $B_1$-$B_n$ and (ii) a switch 222, 224 or 226 in series between the corresponding cell and resistor. Each switch 222-226 receives a separate, independent control signal from a control circuit 210 (e.g., Control).

Figure 1B:
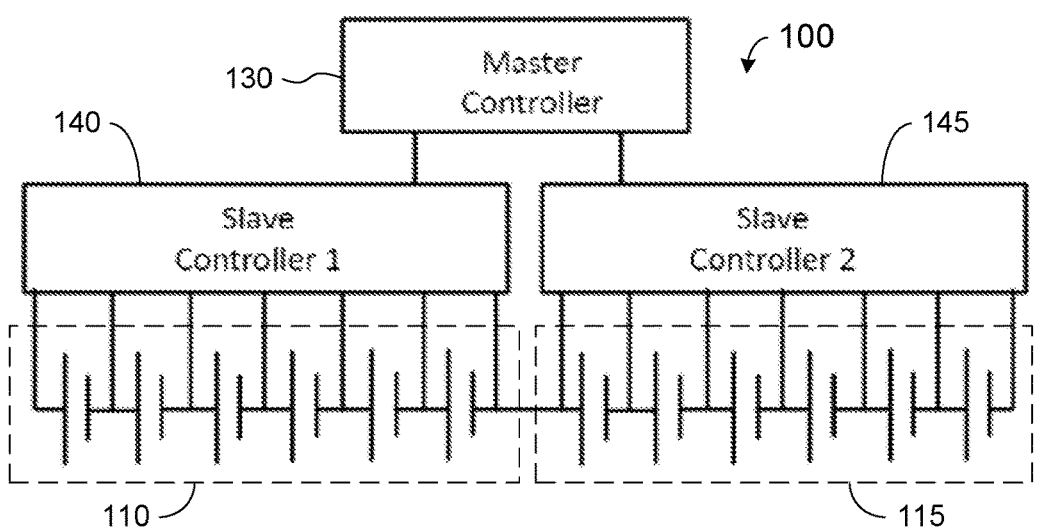
Figure 1C:
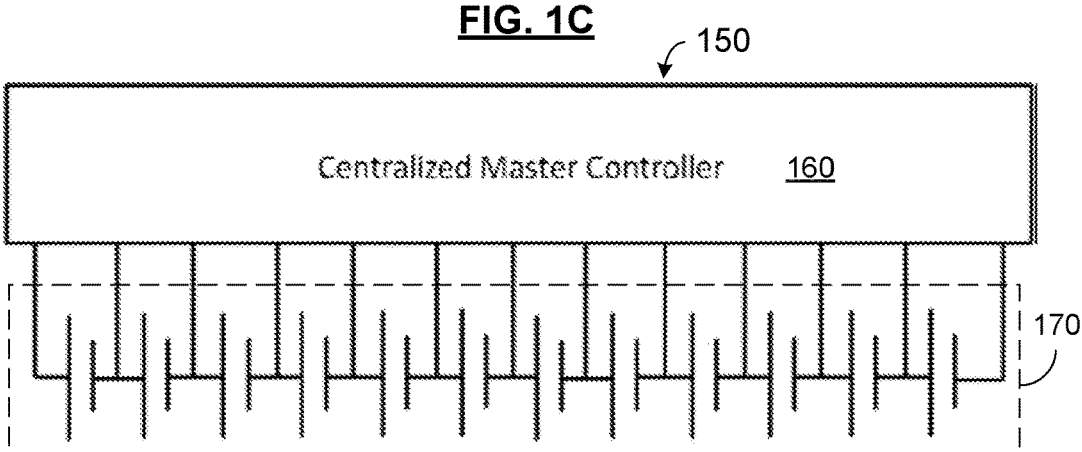

Each switch 222-226 and resistor $R_1$-$R_n$ in the cell balancing circuitry can be implemented using a PDPS or other elemental silicon layer (e.g., for the source, channel and drain in a transistor functioning as a switch, and in the form of a silicon trace or line having a predetermined resistance and functioning as a resistor) in a printed and/or thin film IC. When a switch 222, 224 or 226 is implemented using a PDPS layer, in general, to carry a high current, the switch 222, 224 or 226 may comprise a plurality of PDPS-containing transistors in parallel, accompanied by appropriately-sized drivers and level-shifters to condition the control signals so that the parallel transistors function (e.g., switch states and/or conduct electrical carrier[s]) in a predetermined manner. The control circuit 210 is conventional, and may correspond to the Master Controller 30 or 130 in FIGS. 1A-B or part of the Centralized Master Controller 160 in FIG. 1C. In the case of FIG. 1A, each switch 222-226 and the corresponding resistor $R_1$-$R_n$ may be included in and/or correspond to one of the slave units 10*a-f*. In the case of FIG. 1B, each Slave Controller 140 and 145 may include the switches 222-226 and corresponding resistors $R_1$-$R_n$ as shown in FIG. 3. In the case of FIG. 1C, the Centralized Master Controller 160 includes the switches 222-226 and corresponding resistors $R_1$-$R_n$ as shown in FIG. 3. The present invention is useful in any of the BMS topologies in FIGS. 1A-C, but may be more advantageous in the topologies of FIGS. 1A-B.

Cell balancing using the passive switched resistor cell balancing control system 200 in FIG. 3 may also be known as controlled shunting resistor balancing or switched shunt resistor (SR) balancing, and is based on removing the energy from the cell(s) with a higher voltage output in a controlled way (e.g., intermittently) using the switches, rather than continuously. It can work in two modes. In a first or continuous mode, all switches 222-226 are controlled by the same control (e.g., on/off) signal. In a second or detection mode, the cells' voltages are monitored (e.g., as explained herein). When imbalance conditions are sensed (e.g., one cell's voltage differs from another cell's voltage by more than a threshold amount), the master controller 210 determines which switch 222, 224 or 226 to turn on (e.g., connect, thereby passing current through the corresponding resistor). This method is efficient, simple, reliable and can be used to manage cells in lithium ion batteries.

However, excess energy from the cell(s) with higher voltages is dissipated as heat. Consequently, a thermal management system (e.g., as described herein) may be beneficial. Furthermore, if any cell balancing switches are turned on during discharge of the battery, this may shorten the battery's operating time (or lifetime).

Figure 4:
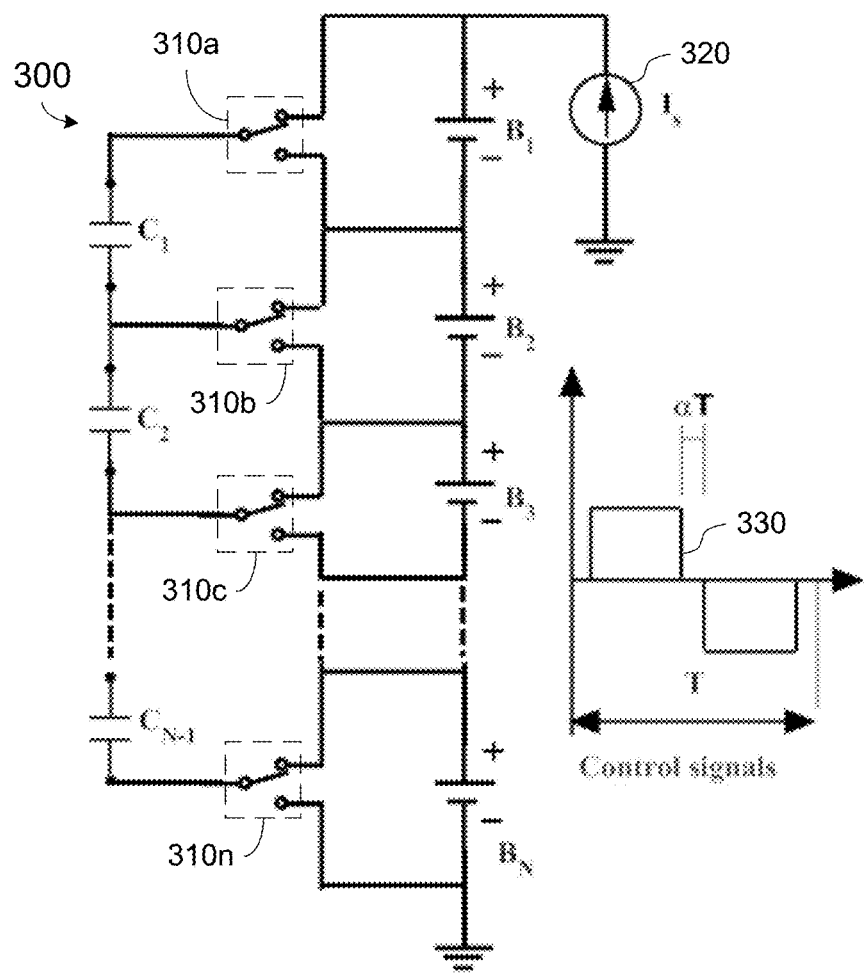
FIG. 4 is a diagram showing an exemplary switched capacitor (SC) cell balancing scheme according to embodiments of the present invention.

FIG. 4 shows a switched capacitor (SC) cell balancing scheme 300. It includes n−1 capacitors and 2n switches 310*a*-310*n* to balance n cells $B_1$-$B_n$. In one implementation, the two switches corresponding to one cell can be or comprise one PMOS transistor and one NMOS transistor in parallel, where each of the PMOS transistor and NMOS transistors have one source/drain terminal electrically connected to a capacitor electrode (or to a node electrically connected to adjacent capacitor electrodes) and the other source/drain terminal electrically connected to nodes across a battery cell. The control strategy using the scheme 300 of FIG. 4 can be simple because, in the PMOS/NMOS transistor implementation in which each NMOS transistor receives one state of a control signal and each PMOS transistor receives the complementary state of the control signal, the cell has only two states. Such a strategy does not need intelligent control, and it can work during both discharging and recharging operations. In addition, the switched capacitor topology 300 shown in FIG. 4 may require a relatively long equalization time in comparison with other capacitor-based balancing schemes.

However, the scheme 300 of FIG. 4 is not limited to the simple implementation described herein. In alternative schemes, each switch 310*a*-310*n* may receive an independent control signal (in which case each pair of switches may have up to three states: switch 1 on, switch 2 off; switch 1 off, switch 2 on; or both switch 1 and switch 2 off (a fourth state, both switch 1 and switch 2 on, is possible, but not preferred), or each pair of switches may receive an independent control signal and its complement (in which case each pair of switches may have two states: switch 1 on, switch 2 off; or switch 1 off, switch 2 on). Each of these configurations may benefit from the presence of a switch 310*a*-310*n* serially connected between each cell $B_1$-$B_n$ of the battery and a terminal of a corresponding capacitor.

Figure 5:
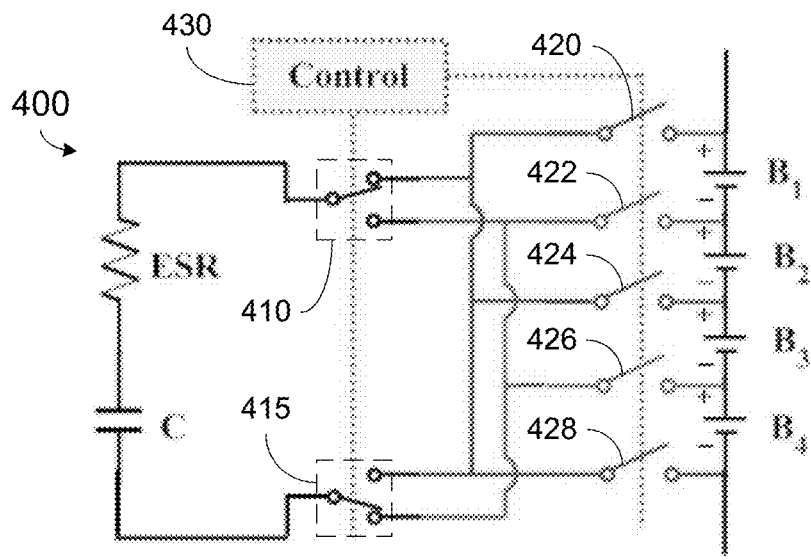
FIG. 5 is a diagram showing an exemplary single switched capacitor (SSC) balancing topology according to embodiments of the present invention.

FIG. 5 shows a single switched capacitor (SSC) balancing topology 400. It can be considered a derivation of the switched capacitor topology 300 of FIG. 4, but it uses only one capacitor C. For a battery or battery module that has n cells, the SSC topology includes n+3 switches to balance the n cells. The controller 430 determines cells with relatively high and relatively low voltages and selects (e.g., closes or turns on) the corresponding switches 410, 415 and 420-428 to transfer energy between the high and low cells. More advanced control strategies can increase the balancing speed.

Figure 6:
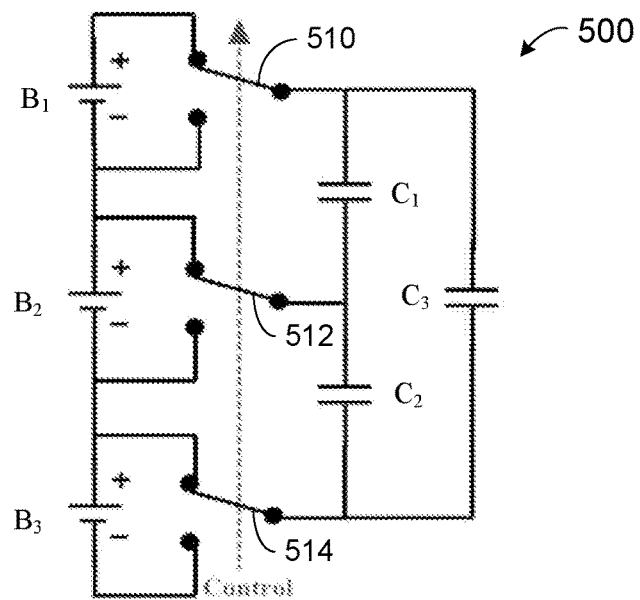
FIG. 6 is a diagram showing an exemplary double-tiered switched capacitor (DTSC) balancing scheme according to embodiments of the present invention.

FIG. 6 shows a double-tiered switched capacitor (DTSC) balancing scheme 500. The difference between the DTSC balancing scheme 500 of FIG. 6 and the switched capacitor scheme 300 of FIG. 4 is that the DTSC balancing scheme 500 of FIG. 6 includes two capacitor tiers for energy transfer between the high-voltage and low-voltage cells. It needs n capacitors and n or 2n switches 510-514 to balance n cells (e.g., $B_1$-$B_3$). The advantage of the double-tiered switched capacitor balancing scheme 500 is that the second capacitor tier reduces the balancing time to a quarter of the time of the switched capacitor scheme 300. As for other capacitor-based topologies, the DTSC balancing scheme 500 of FIG. 6 works during both discharging and recharging operations.

Figure 7:
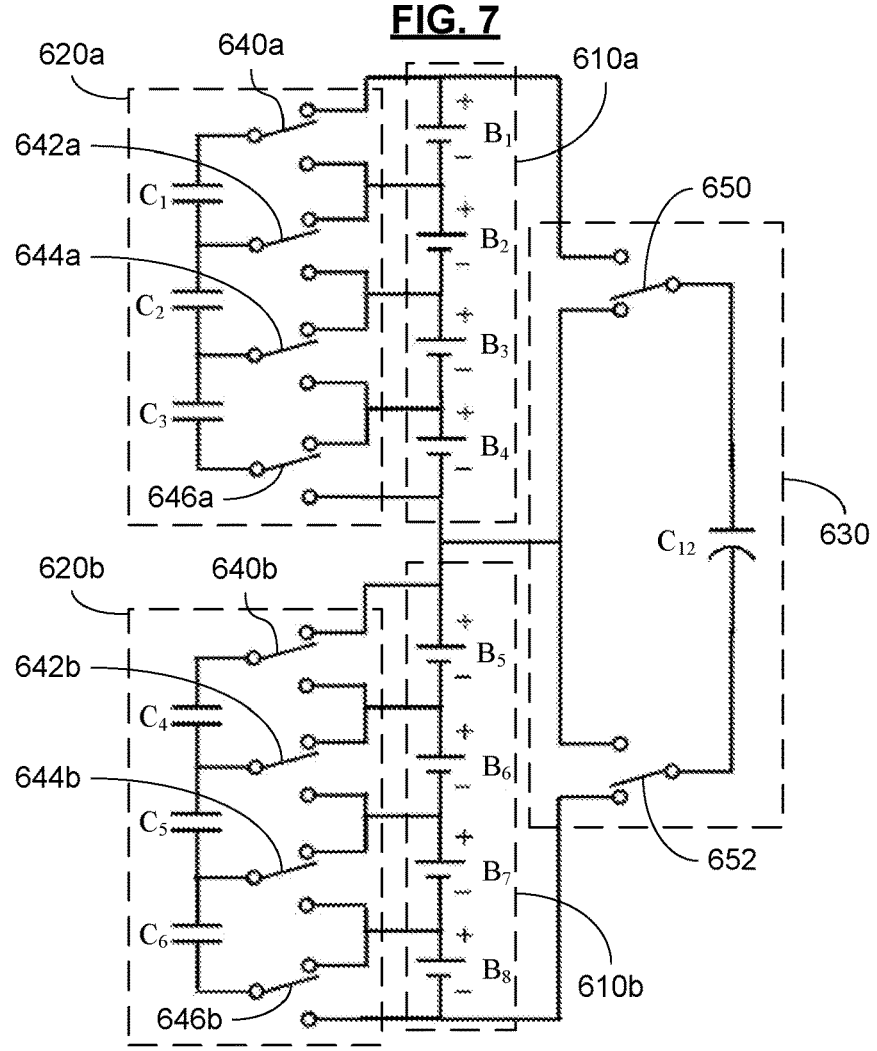
FIG. 7 is a diagram showing an exemplary modularized switched capacitor (MSC) balancing topology according to embodiments of the present invention.

FIG. 7 shows a modularized switched capacitor (MSC) balancing topology 600 that applies a switched capacitor topology to battery modules 610a-b. When the battery pack is divided into modules (e.g., module 610a containing cells $B_1$-$B_4$ and module 610b containing cells $B_5$-$B_8$ in FIG. 7), individual cells within each module 610a-b are controlled and/or balanced using a separate equalization system 620a or 620b for that module. A different equalization system 630 between the modules 610a-b reduces the voltages and the current stress on the switches 640a-646b.

For monitoring, typically, at least the individual cell voltage and temperature are monitored. Individual cell voltages may be monitored using a variation of a conventional ammeter circuit, in which the shunt resistor of the conventional ammeter can be or can comprise a PDPS or other doped elemental silicon resistor, printed or otherwise formed on a flexible substrate such as a flexible PCB. Individual cell and/or module temperatures may be monitored conventionally or, similar to a voltage monitor, using a variation of a conventional temperature sensor, in which the resistor(s) of the conventional temperature sensor can be or comprise a PDPS or other doped elemental silicon resistor printed or otherwise formed on a flexible substrate such as a flexible PCB.

Thus, PDPS- or other doped elemental silicon-based circuitry can be used for active or passive cell balancing circuitry and/or analog front-end integrated circuitry that manages battery cell balancing and performs defect management. The circuitry is controlled by a BMS that may be implemented using conventional electronics. The analog front-end integrated circuitry may include multiplexers and switches that are used in circuits to monitor individual battery cells and connect or disconnect the cells, depending on the operational state of the cell.

Cell balancing topologies using inductors or transformers to move energy from a cell or group of cells to another cell or group of cells offer a smaller balancing time than other approaches. However, they have a relatively high cost, and can introduce magnetic losses for the transformer-based topologies. In addition, when the switching frequency is sufficiently high, filter capacitors are advantageously placed across each battery to filter the high-frequency signals.

Figure 8A:
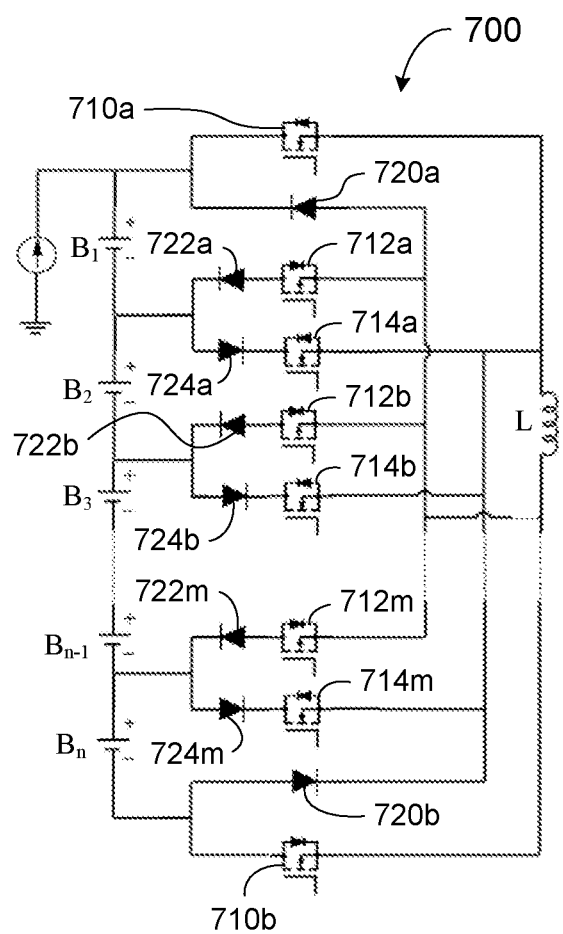
FIGS. 8A-B are diagrams showing exemplary switched inductor balancing systems according to embodiments of the present invention.

FIG. 8A shows a single switched inductor (SSI) balancing system 700, which utilizes one inductor L and 2n switches 710a-b, 712a-m and 714a-m for transferring energy between the cells $B_1$-$B_n$ in the entire battery or module. The system senses the voltage of each cell $B_1$-$B_n$ and selects the cells between which energy will be transferred. Diodes 720a-b, 722a-m and 724a-m ensure that the current in the corresponding wires or traces flows in a single predetermined direction.

Figure 8B:
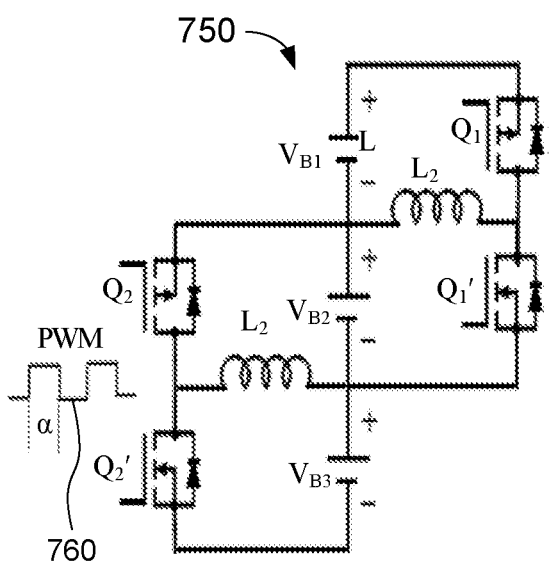

A multi-switched inductor (MSI) balancing system 750 shown in FIG. 8B uses n−1 inductors L and 2(n−1) switches $Q_1$-$Q_2'$ for balancing n cells. The controller (not shown) senses the voltage difference of two neighboring cells, then applies a pulse width modulated (PWM) control signal 760 with a condition that the cell with the higher voltage must be switched on first. The switched inductor balancing systems 700 and 750 have a relatively fast equalization time, but it may take a relatively long time to transfer the energy from the first cell to the last cell, especially for a battery or module with many cells (e.g., 8 or more). The SSI balancing system 700 (FIG. 8A) has a shorter equalization time than the MSI topology 750 (FIG. 8B).

Figure 9:
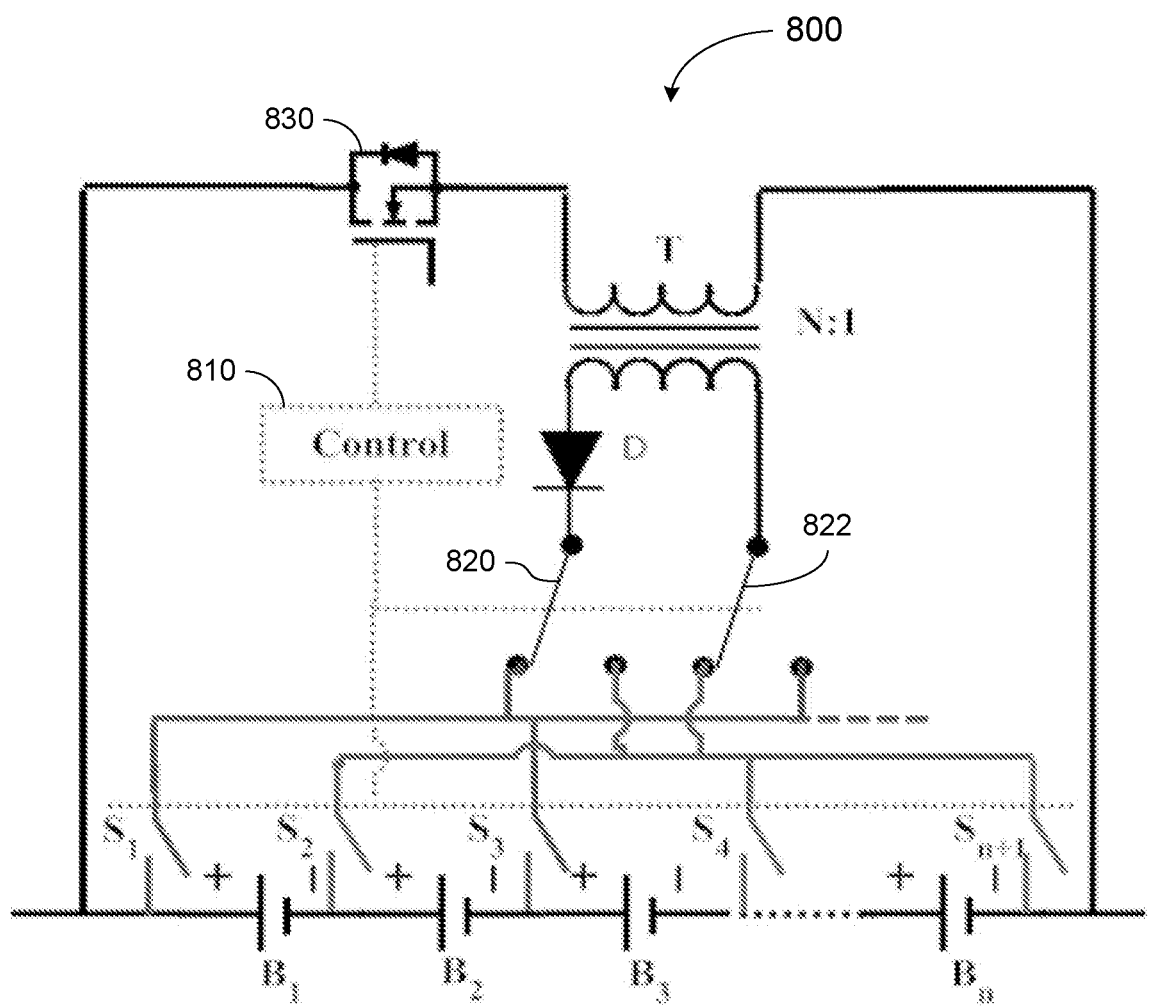
FIG. 9 is a diagram showing an exemplary single winding transformer (SWT) or "switched transformer" (ST) topology according to embodiments of the present invention.

FIG. 9 shows a single winding transformer (SWT) or "switched transformer" (ST) topology 800, which may also be a selectable energy converter. The SWT or ST topology 800 can include either of two sub-topologies for cell balancing. The first sub-topology 800, shown in FIG. 9, may be known as a "pack-to-cell topology" and is based on carrying the energy from the whole battery or module through the switching transformer T (e.g., using switch 830) and transferring that energy to the weak cell(s) using the corresponding switch(es) $S_1$-$S_{n+1}$. The second sub-topology (not shown) may be known as a "cell-to-pack topology" and transfers the energy from the high-voltage cell(s) through the transformer T into the battery pack (e.g., the battery as a whole).

Figure 11:
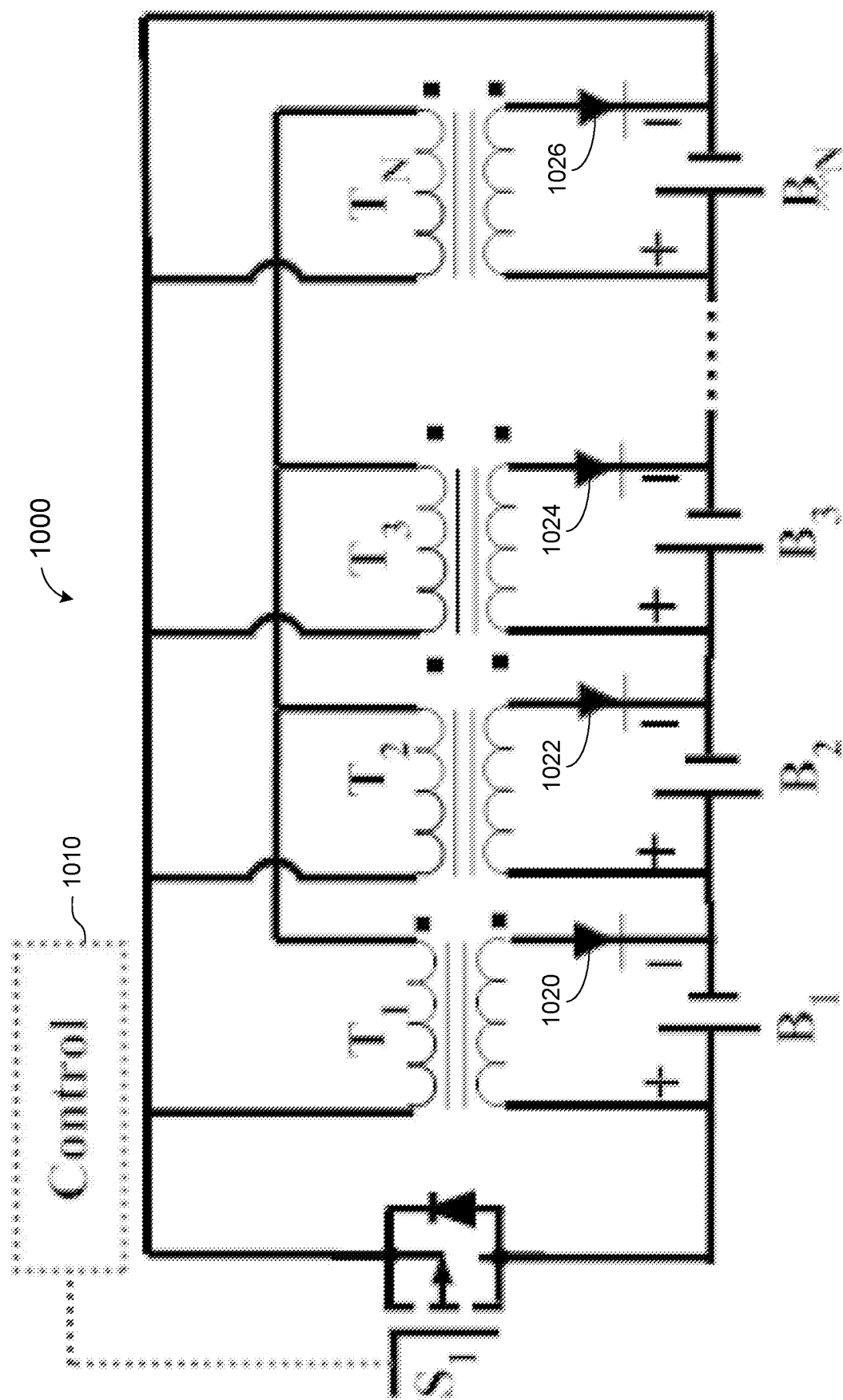

FIGS. 10-11 show multi-winding transformer (MWT) balancing topologies 900, 900' and 1000. A first multi-winding transformer topology 900, shown in FIG. 10A, is known as a "shared transformer" topology. A second topology 1000 is known as multiple transformer (MpT) balancing and is shown in FIG. 11.

The MWT "shared transformer" topology 900/900' has a single magnetic core with one primary winding 910 and multiple secondary windings 915a-n, one for each cell $B_1$-$B_N$. It has two circuit configurations: a flyback configuration 900 shown in FIG. 10A, and a forward configuration 900' shown in FIG. 10B.

In the flyback configuration 900 (FIG. 10A), the switch $S_1$ connected to the primary winding 910 is on, storing some energy in the transformer. When the switch $S_1$ is switched off, the energy is transferred to the secondary side of the transformer (i.e., windings 915a-n). Most of the induced current will be provided to the cell(s) with the lowest voltage via the corresponding diode(s) $D_1$-$D_N$.

In the forward configuration 900' (FIG. 10B), when a (minimum) voltage difference among the cells $B_1$-$B_N$ is detected, the switch $S_1$-$S_N$ connected to the cell $B_1$-$B_N$ with highest voltage is switched on, and energy is transferred from this cell to other cells $B_1$-$B_N$ via the secondary windings 915a-n and the diode antiparallel to the switch $S_1$-$S_N$, then through the primary transformer winding 910. While the forward configuration 900 may be more efficient and consume less power than the flyback configuration 900', the circuitry in the forward configuration 900 is relatively complex and relatively high-cost, and may have issues with saturation.

The multiple transformer balancing topology 1000 shown in FIG. 11 uses several multiple-core transformers $T_1$-$T_N$, one transformer for each cell $B_1$-$B_N$, and one switch $S_1$. The switch $S_1$ and diodes 1020-1026 function similarly or identically to the switch $S_1$ and diodes $D_1$-$D_N$ in the scheme 900 in FIG. 10A. Compared to the MWT scheme 900' of FIG.

10B, this approach is more easily adapted for modular designs and battery extensions without changing the magnetic core, although its expense may be relatively high. However, all inductor and/or transformer balancing systems can also be used with battery modules similarly or identically to the switched capacitor topologies discussed above. Modular inductor/transformer balancing systems implement a modular approach by dividing the battery into groups or modules that reduce the voltage and/or the current stress in the switching components.

Energy converter cell balancing topologies include several types, such as Ćuk converters, buck and/or boost converters, flyback converters, ramp converters, full-bridge converters and quasi-resonant converters. They enable full control of cell balancing, but have a relatively high cost and complexity.

Figure 12:
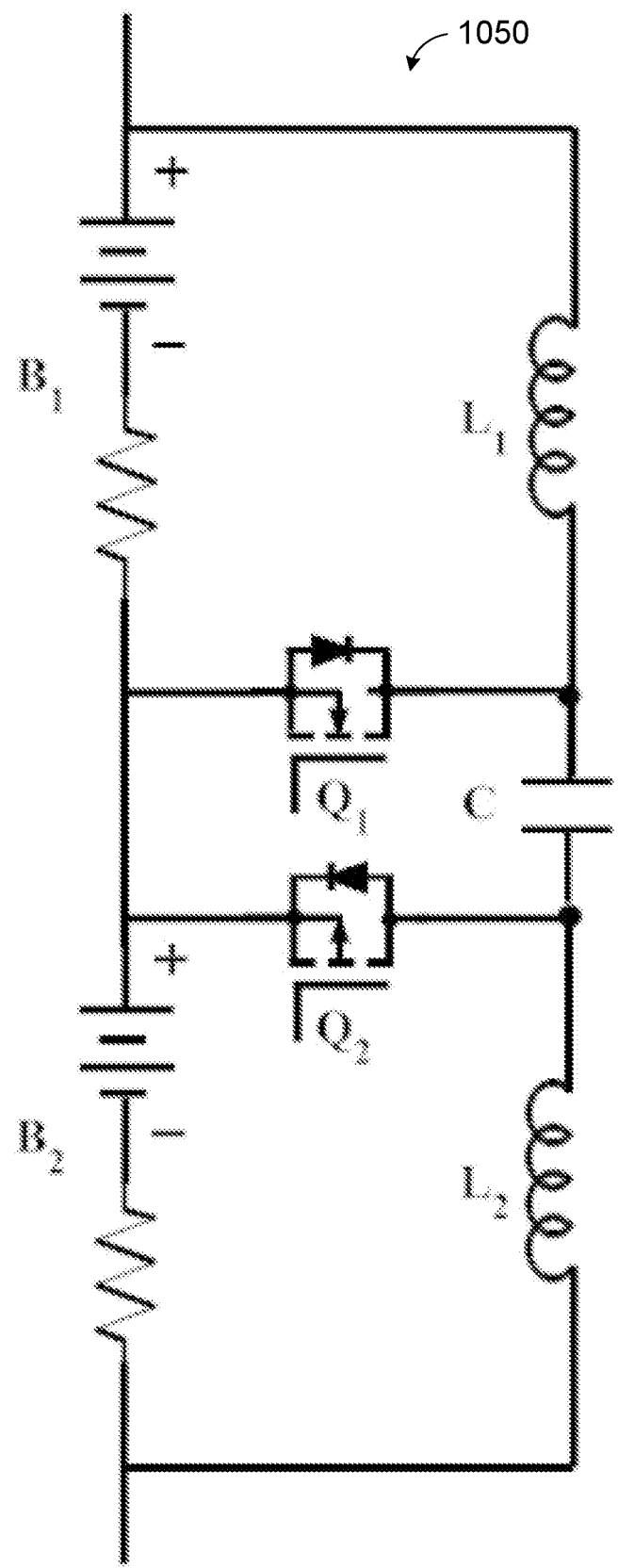
FIG. 12 is a diagram showing an exemplary bi-directional Ćuk converter according to embodiments of the present invention.

A bi-directional Ćuk converter 1050 is shown in FIG. 12 and can be considered an individual cell equalizer (ICE) topology, which balances each pair of neighboring or adjacent cells $B_1$-$B_2$. It requires n−1 ICE circuits to balance n cells. Each ICE circuit includes two inductors $L_1$-$L_2$, two switches $Q_1$-$Q_2$, and one capacitor C. One inductor and one switch may be shared by two adjacent Ćuk converters. Since the Ćuk converter transfers energy between two neighboring cells $B_1$-$B_2$, it may take a relatively long time to equalize all cells in a battery or module, especially for batteries or modules having a relatively large number of cells (e.g., 8 or more).

Figure 13:
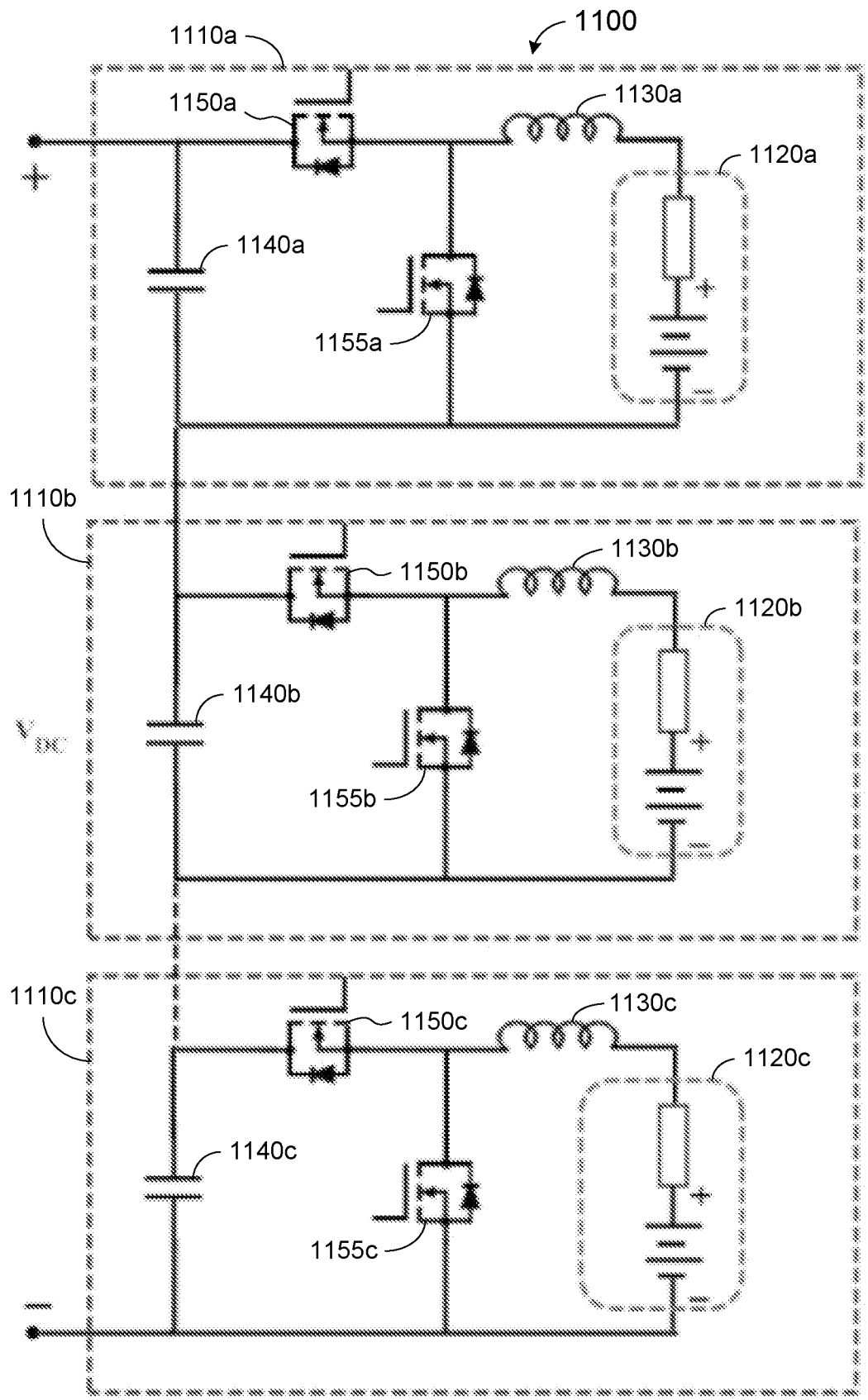
FIGS. 13-15 are diagrams showing exemplary step down (buck), step-up (boost) and buck-boost direct current (DC) energy converters according to embodiments of the present invention.
Figure 14:
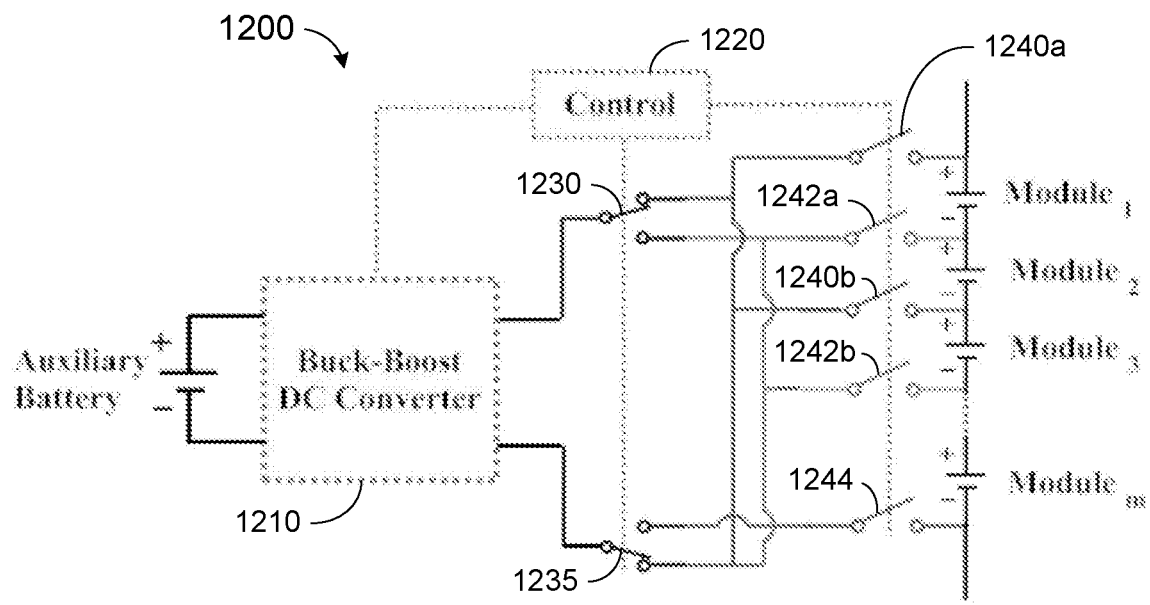

Step down (buck), step-up (boost) and buck-boost direct current (DC) energy converters are widely used in cell balancing systems. These converters have several balancing topologies, such as the buck DC converter 1100 shown in FIG. 13 (which is used to transfer energy from a power source or the battery to one or more weak cells), a boost converter (which can be used to remove excess energy from a single cell to the entire module or battery), or the buck-boost converter 1210 shown in FIG. 14 (which can be used to remove excess energy from the highest cells to a DC link, a storage element, or an EV auxiliary battery, and retransfer the energy to the weak cell[s]). Optimally, the buck-boost converter 1210 is accompanied by a voltage sensor on each cell (e.g., $Module_1$-$Module_m$), as well as a controller 1220 with sufficiently complex logic to conduct operations of the converter 1210. Step down, step-up and buck-boost converter balancing topologies are relatively expensive and complex, but they have high efficiency and are suitable for modular design.

Figure 15:
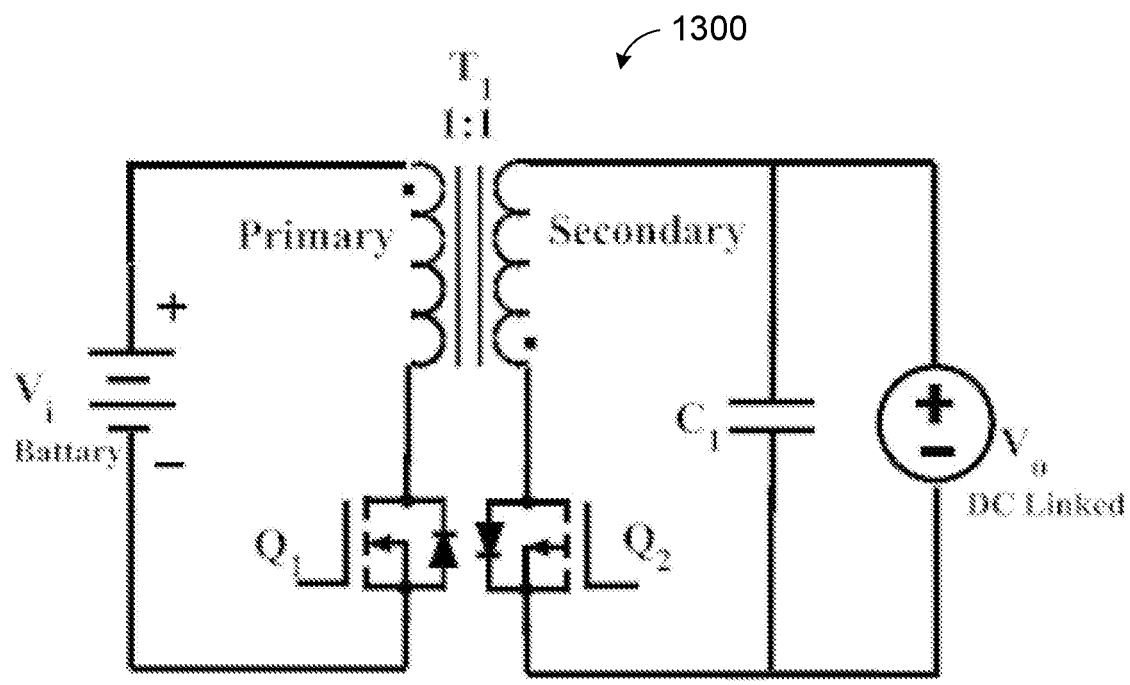

Flyback converters (FbC) are used in isolated structures, and they can be unidirectional or bidirectional, as shown in the scheme 1300 in FIG. 15. In the unidirectional FbC converter, energy from the higher-voltage cell is stored in the transformer $T_1$ when the coupled switch (e.g., $Q_1$) is on, and then transferred to the battery $V_1$ when the coupled switch $Q_1$ is off. The bidirectional flyback converter is more flexible in energy transmission, since the energy also can be transferred from the battery $V_1$ to the low-voltage cell(s). However, there can be issues with uniformity of the windings, as well as with magnetic losses in the transformer.

Figure 16:
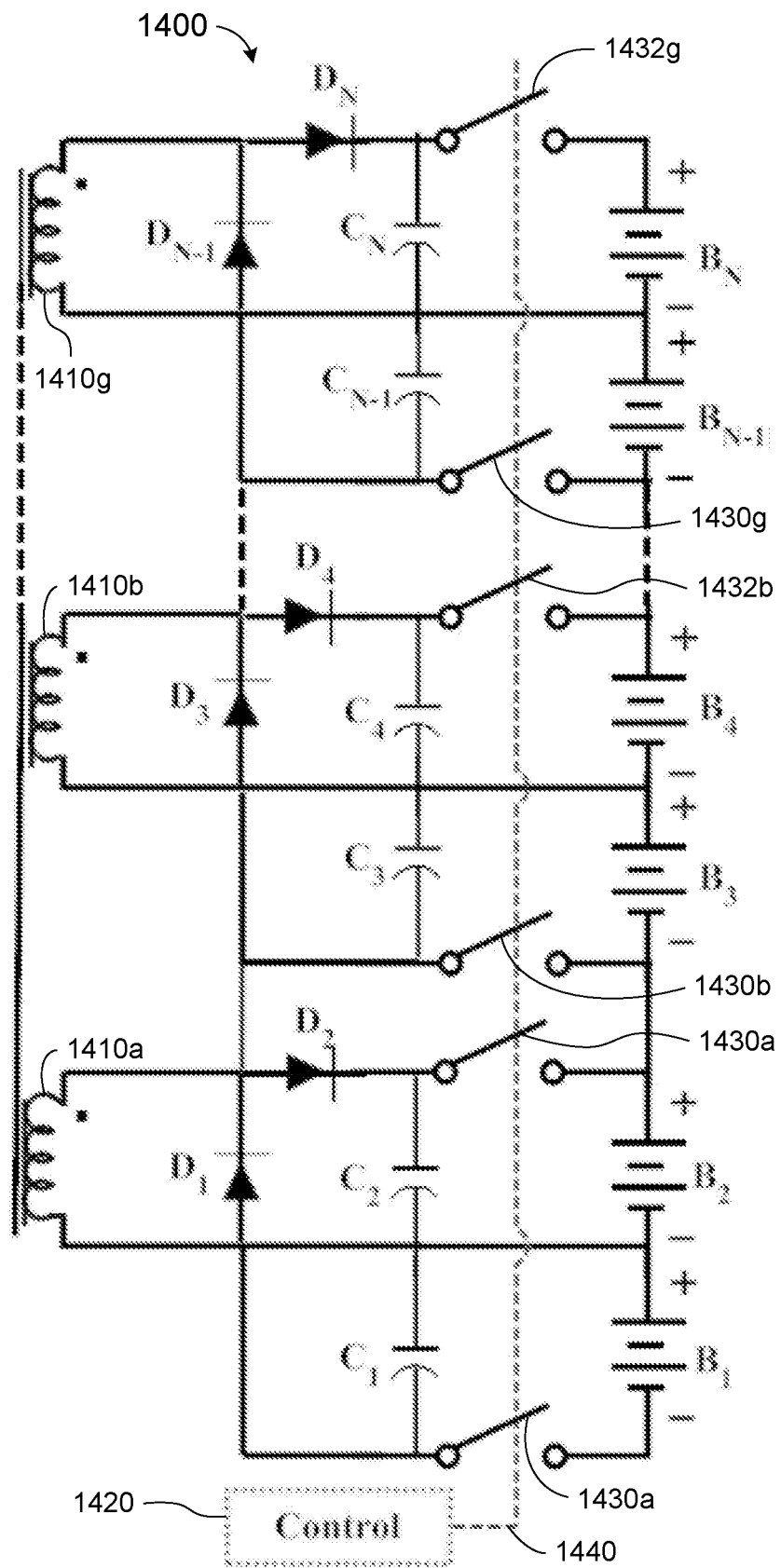
FIG. 16 is a diagram showing an exemplary ramp converter (RC) cell balancing topology according to embodiments of the present invention.

A ramp converter (RC) cell balancing topology 1400 is shown in FIG. 16. The RC cell balancing topology shares the same or similar concepts as other multi-winding transformer topologies. It may include only one secondary or complementary winding 1410a-1410g for each pair of cells (where g=n/2, n being an even number), instead of one secondary or complementary winding per cell. A single control signal 1440 may be supplied to all of the switches 1430a-1432g, although the invention is not limited thereto. The ramp converter operation can be summarized as follows: in the first half-cycle, most of the current (e.g., from the converter) charges the lowest voltage cell(s) among the odd-numbered cells. In the second half-cycle, the current is supplied to the lowest voltage cell(s) among the even-numbered cells.

Figure 17:
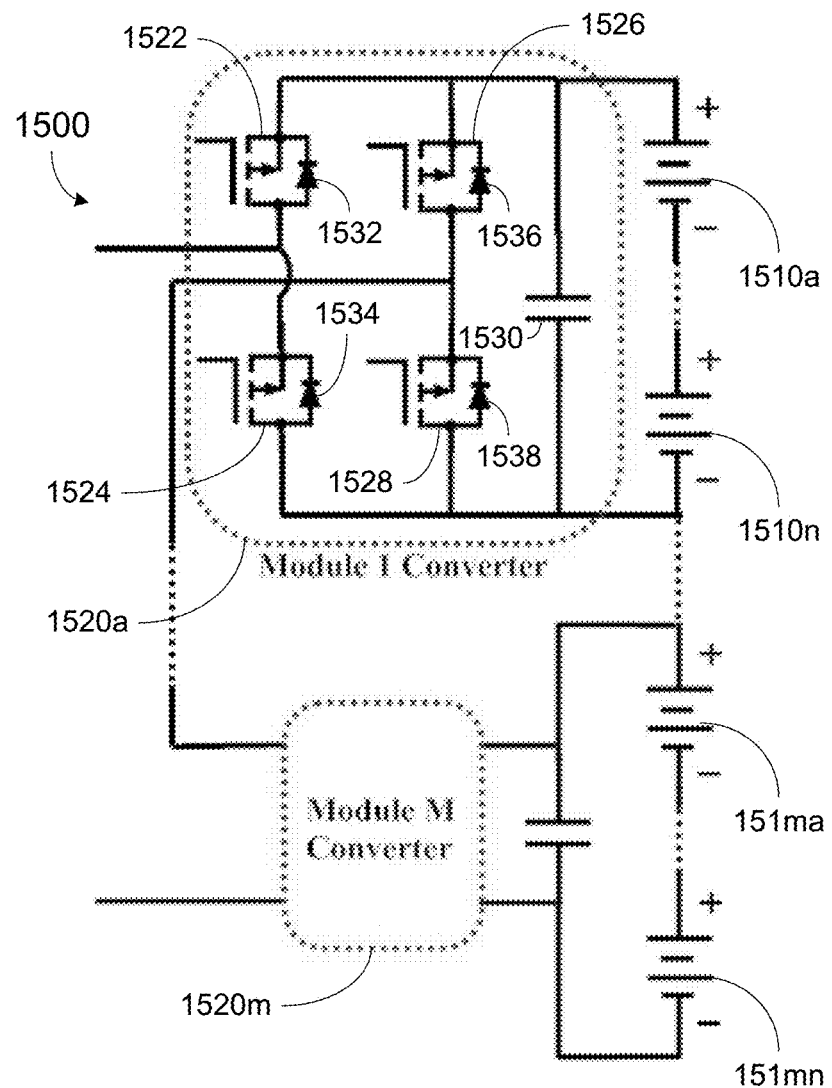
FIG. 17 is a diagram showing an exemplary full-bridge converter according to embodiments of the present invention.

FIG. 17 shows a full-bridge converter 1520a that includes four switches 1522-1528 and four diodes 1532-1538 in a full-bridge configuration, similar to a full-bridge rectifier. Each converter 1520a-m balances a corresponding plurality of cells 1510a-n through 151ma-n. The diodes 1532-1538 may be antiparallel to the switches 1522-1528. Furthermore, the switches 1522-1528 may receive one or more PWM control signals, as described herein. It can be considered to be a fully-controlled energy converter. It can used in alternating current (AC) or DC mode, which makes it suitable for plug-in hybrid electric vehicle (PHEV) batteries or as a DC-DC converter in other battery-based applications. Full-bridge converter topologies such as the topology 1500 shown in FIG. 17 have a high power rating and are optimal for modulated battery management. However, they generally benefit from a controller with sufficiently complex logic to conduct operations of the converter. Furthermore, full-bridge converter topologies have a relatively high cost.

Figure 18:
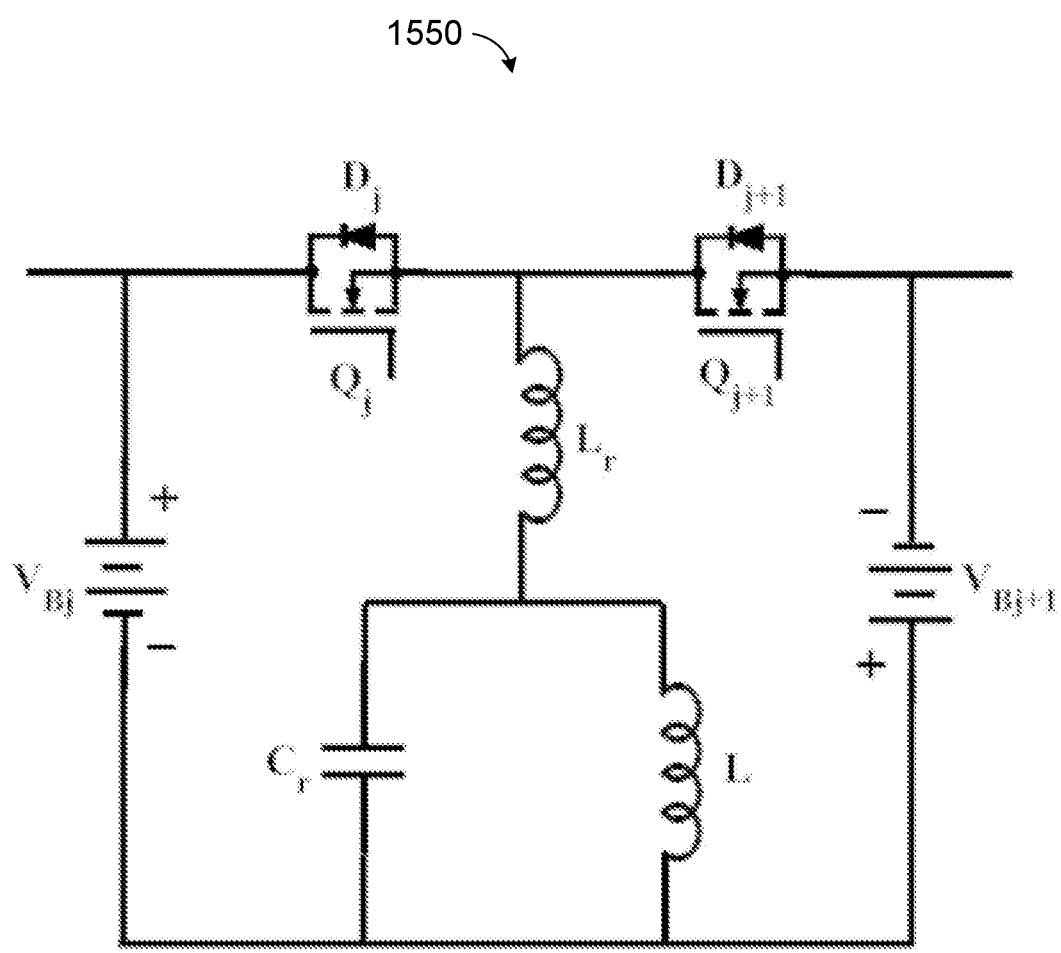
FIG. 18 is a diagram showing an exemplary quasi-resonant converter topology according to embodiments of the present invention.

FIG. 18 shows a quasi-resonant converter topology 1550 that can be either zero-current quasi-resonant (ZCQR) or zero-voltage quasi-resonant (ZVQR). Instead of using intelligent control to generate a PWM control signal, resonance circuits (e.g., LC circuits) are used both to transfer energy and to drive the switches $Q_j$-$Q_{j+1}$. The inductor $L_r$ and the capacitor $C_r$ are constructed as a resonant tank to achieve the zero current switching function for the battery equalizer (which, as shown, is symmetrical and bi-directional). Quasi-resonant converter balancing circuits can reduce switching losses relative to other topologies, thus increasing the balancing system efficiency, but they may have complex control mechanisms, sensitive implementations, and relatively high cost.

The battery cell balancing circuit can be included in a wireless device (i.e., including an antenna). The following description of embodiment(s) including an antenna can also apply to embodiments including an inductor or transformer.

Figure 19A:
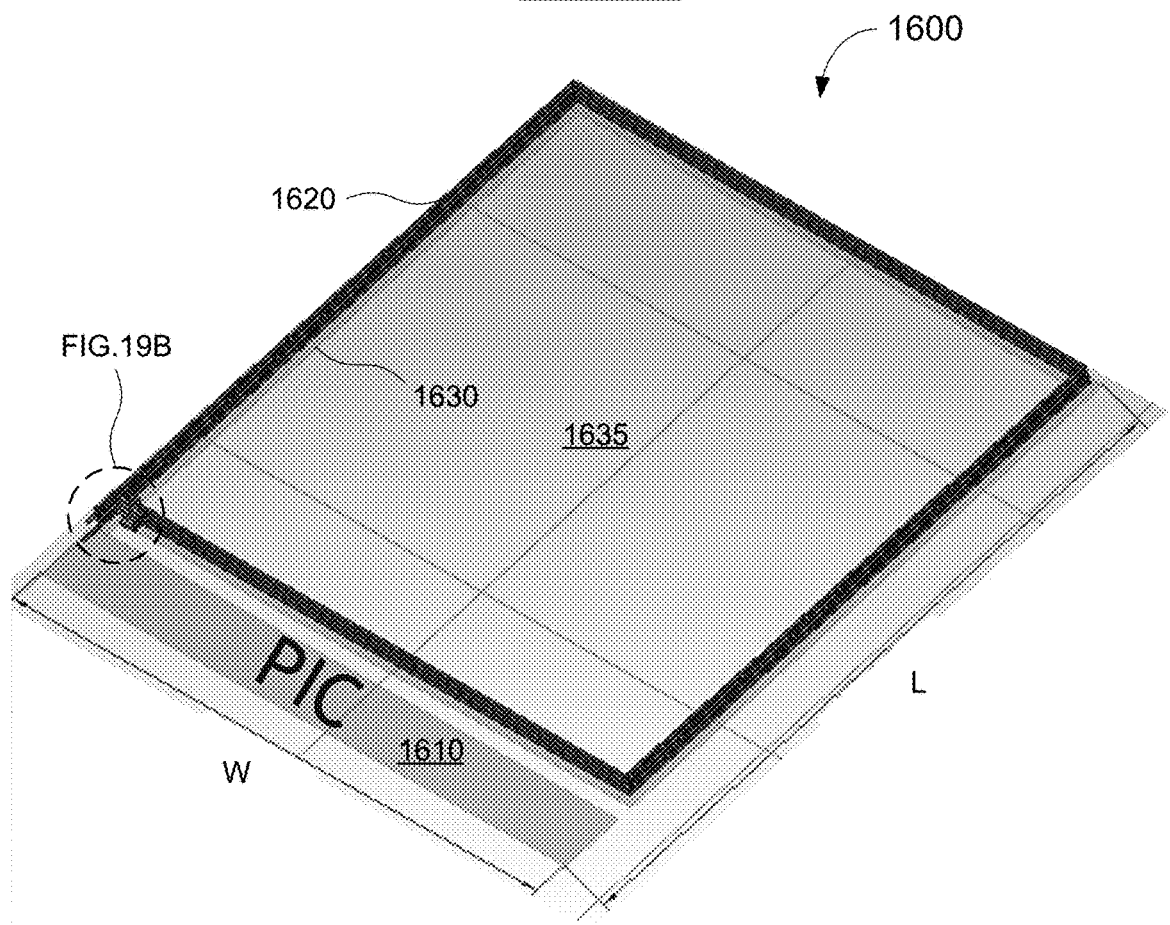
FIGS. 19A-B are diagrams showing an exemplary printed and/or thin film integrated circuit (PIC) including an integrated antenna according to embodiments of the present invention.

FIG. 19A shows a first configuration 1600 of the PIC 1610 with an integrated antenna 1620 in a 3D spiral structure, with the axis of the spiral perpendicular to the substrate. In one example, the substrate may comprise stainless steel (see U.S. Pat. Nos. 9,183,973 and 9,299,845). The antenna 1620 has a substantially spiral structure (e.g., when viewed from the side), and a square or rectangular shape in a plan view (as shown), although other shapes are suitable. At least one side of the antenna 1620 should be linear (straight or substantially straight). For example, the square or rectangular antenna 1620 may have a width W of from 2 to 20 mm, the PIC 1610 may have a length equal to or less than the width W of the antenna, the length L of the combined antenna 1620 and PIC 1610 may be from 3 to 30 mm, and the PIC 1610 may have a width of from 1 to 8 mm, but the dimensions of the antenna 1620 and PIC 1610 are not so limited. When the antenna 1620 is round or circular, it may have a diameter of from 2 to 20 mm.

Typically, the antenna 1620 includes aluminum (Al) on a plastic substrate, such as polyethylene terephthalate (PET). Such a configuration may be used in conjunction with a relatively large antenna 1620 fabricated on a plastic substrate 1630. For example, the antenna 1620 may have a width W1 of from 15 mm to 50 mm and a length (dimension perpendicular to the width W1) of from 20 mm to 75 mm, although this configuration is not so limited. The PIC 1610 may have a width W2 of from 1 to 25 mm and a length of from 2 to 10 mm, and the antenna pad 1615 may have a width and a length within the ranges given for the PIC 1610, although the dimensions of the PIC 1610 and antenna pad 1651 need not be the same or similar.

The PIC pads and antenna pads are generally configured to ensure sufficient signal integrity during load modulation. It may be important to control variations in coupling capacitances due to alignment errors, substrate (e.g., PET) thicknesses (or thickness variations), and variations in the dielectric constant of materials between the antenna pads and the PIC pads.

Typically, the antenna is made using an electrically conducting material. For example, the antenna may comprise aluminum, an aluminum alloy, a tungsten-aluminum (W/Al) or titanium-aluminum (TiAl) bilayer, copper, silver, etc., and may be formed by direct printing or by printing a seed layer (e.g., of palladium or another printable seed metal) and either electroplating or electrolessly plating a bulk metal such as aluminum of copper thereon. The antenna may have a thickness of 1-100 μm, although the invention is not limited to this range of thicknesses.

In embodiments using contacts (e.g., to connect different layers of the antenna or to connect the antenna terminals to a metallization layer in the PIC), a via is formed in one or more insulator or dielectric layers. Such vias may have a size (e.g., a diameter, or length and width dimensions) of from 0.1 mm to 3 mm, although the invention is not limited to such dimensions. Such vias can include through vias and blind vias.

The PIC may have a maximum thickness of 5 mm, or any maximum value less than 5 mm (although the invention is not limited to such a maximum thickness). Such a maximum thickness can ensure compatibility with existing processing and application (e.g., labelling) equipment, as well as compliance with certain form requirements (e.g., for bar code labels) and/or standards. The maximum thickness of the PIC may be particularly important in embodiments that include a 3D (or solenoid-type) antenna, as discussed herein (see, e.g., the third configuration above).

Figure 19B:
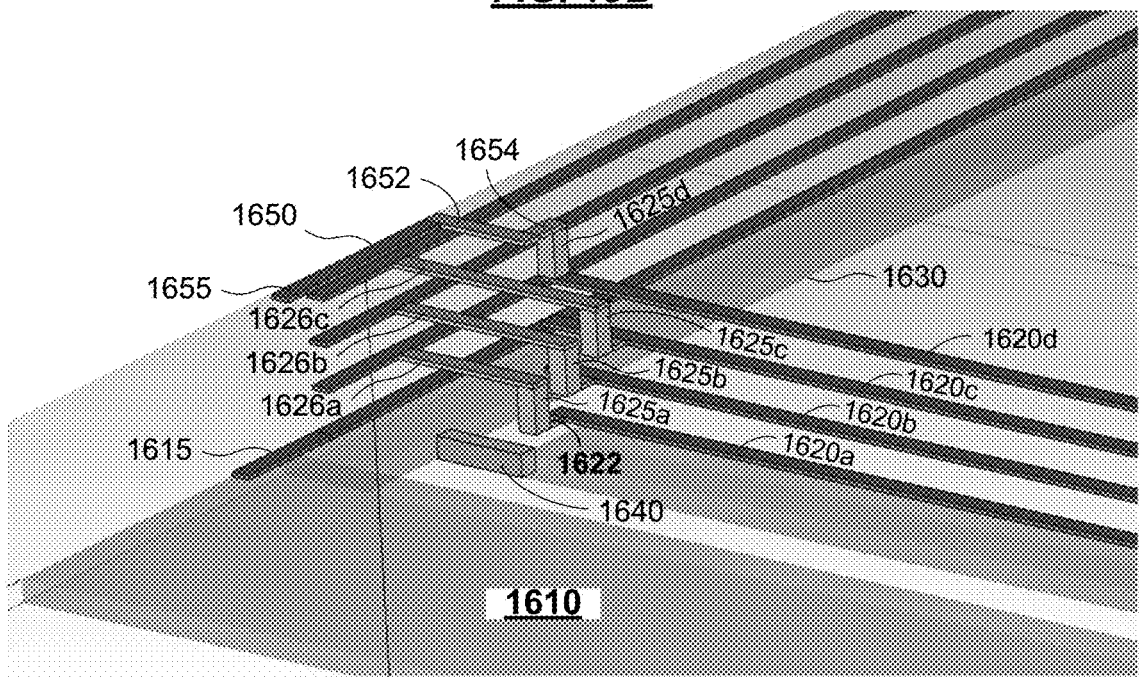

FIG. 19B shows the portion of the PIC 1610 with integrated antenna 1620 labeled "1B" in FIG. 19A. Four layers 1620*a-d* of the antenna 1620 are shown for illustration. Each subsequent layer is directly or substantially directly over each preceding layer. For example, layer 1620*d* is directly or substantially directly over each of the layers 1620*a*, 1620*b* and 1620*c*. Each layer 1620*a-d* may have one or more turns. Adjacent layers (e.g., 1620*a* and 1620*b*) are connected through an offset segment 1622, a contact 1625, and a linking segment 1626. For example, layer 1620*a* is connected to layer 1620*b* by the offset segment 1622, the contact 1625*a*, and the linking segment 1626*a* (which is actually in the second layer of the antenna 1620). The offset segments 1622 ensure that the linking segments 1626*a-c* overlap with each other and allow placement of the contacts (and the formation of corresponding vias) that are offset from each other. For example, contact 1625*b* is adjacent to the end of linking segment 1626*a* by about a minimum spacing for such features according to the design rules for the manufacturing process. Linking segment 1626*a* is connected to, in the same layer as, and formed at the same as antenna layer 1620*b* (as is offset segment 1622*b*, not labeled in FIG. 19B).

The uppermost layer 1620*d* is connected to an upper antenna terminal 1655 through a contact 1625*d*, an optional offset segment 1654, a linking segment 1652 and a bridge 1650. The offset segment 1654, when present, can ensure that the linking segment 1652 overlaps with the other linking segments 1626*a-c*. In fact, the linking segment 1652 is also optional, but it ensures that the bridge 1650 overlaps the underlying antenna layers 1620*a-d*. The lower antenna terminal 1615 is essentially an extension of a segment of the first antenna layer 1620*a*. When the bridge 1650 overlaps the underlying antenna layers 1620*a-d*, then either the upper antenna terminal 1655 extends beyond the lower antenna terminal 1615 (and is connected to the PIC 1610 by a series of contacts similar to contacts 1625*a-d* and pads comprising an isolated segment of the metal layer forming the corresponding offset segment, linking segment and antenna layer.

Stamping the substrate to form the opening 1635 may also leave a link 1640 to be cut later. The link 1640 provides mechanical support for the substrate 1630 after stamping, but before subsequent processing.

It some instances, it may be desirable to avoid cutting the link 1640. For example, to avoid having to pattern the substrate, and thus avoid cutting the link 1640, a compensation coil may be formed inside the antenna 1620 to offset the electromagnetic effects of a metal or conductive substrate 1630 near the antenna 1620. The compensation coil can improve coupling and/or reduce eddy currents in the substrate 1630.

Additionally or alternatively, a relatively large capacitor may be employed to provide a similar offset of the electromagnetic effects of the substrate 1630. Use of a compensating coil having a relatively high Q may be particularly advantageous. Alternatively, a ferrite layer can be formed on the patterned or unpatterned substrate 1630 prior to forming the antenna 1620. However, if the ferrite layer is present, the substrate 1630 need not be patterned, and it may be pre-stamped prior to application to the substrate 1630 (e.g., by lamination in a roll-to-roll process).

However, due to the presence of metal and electrolytes in a battery (with the accompanying disruption[s] to wireless communication), wired BMS devices may be desired or necessary. For wired devices, a communications and power bus or structure/group of busses, either analog or digital, can significantly reduce the amount of cabling. For example, higher-level functions and routing may be or comprise exposed PADs forming functional busses up to the next hierarchical level (e.g., between individual cells and the corresponding module, or between modules and the corresponding battery pack). Further, for a battery with balancing at the level of individual cells, the amount of wiring and/or cabling decreases when using the distributed monitoring, processing and management functions and/or capability of the present invention. For state-of-the-present-art batteries performing balancing at the module level, the present invention adds cell-level management with a few extra wires in each module.

When integrated into a conventional battery or battery module, embodiments of the present invention may include a flex PCB with one or more PICs soldered thereon at a low temperature (e.g., using a solder that has a reflow or melting temperature of 220° C. or less (e.g., ≤210° C., ≤200° C., etc.). The flex PCB may also function as a carrier for discrete devices (e.g., capacitors, resistor, diodes, etc.) in electrical communication with the PIC and other components of the BMS and providing contacts and wiring to the main BMS system.

The present PIC may be integrated into the final encapsulated battery cell (and/or battery module). A further embodiment does not include extra encapsulation of the PICs on the flex PCB. For example, glob top encapsulation may be suitable. The integrated flex PCB, with packaged PIC(s) and discrete devices mounted thereon, can then be placed inside a battery module, also reducing the likelihood of mechanical scratching.

Figure 20A:
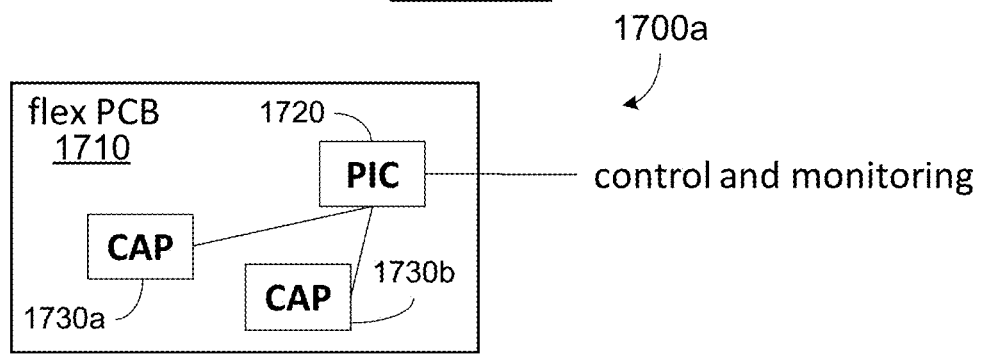
FIGS. 20A-B are diagrams showing exemplary flex PCBs with a PIC and multiple charge-balancing discrete devices thereon according to embodiments of the present invention.

In various embodiments, certain components may be mounted onto traces on the flex PCB using conductive pads (which, in turn, may be connected to one or more PDPS structures). For example, FIG. 20A shows a PIC 1720 containing PDPS or other doped silicon-containing electrical devices (e.g., transistors, diodes, resistors, capacitors, etc.) flip-chip mounted directly onto copper traces (not shown) on the flex PCB 1710. The only extra components needed are the charge- or voltage-balancing components. In the case of FIG. 20A, two charge-balancing capacitors 1730*a-b* are shown. The PIC 1720 performs individual cell monitoring and charge-balancing control functions. Thus, a single flex PCB 1710 so configured may be suitable for controlling charge balancing functions within an entire module.

Figure 20B:
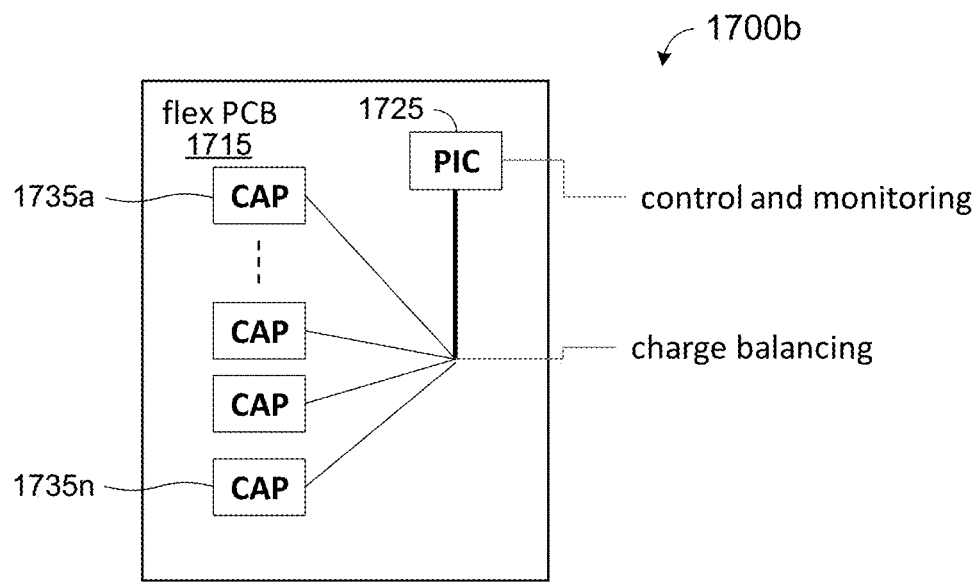

FIG. 20B shows an alternative design 1700*b* in which the flex PCB 1715 includes a series of charge-balancing capacitors 1735*a-n* that communicate in parallel with the PIC 1725. The flex PCB 1715 of FIG. 20B may be suitable for use within a battery module, for example, and a single flex PCB 1715 so configured is suitable for controlling charge balancing functions within the entire module.

Figure 21:
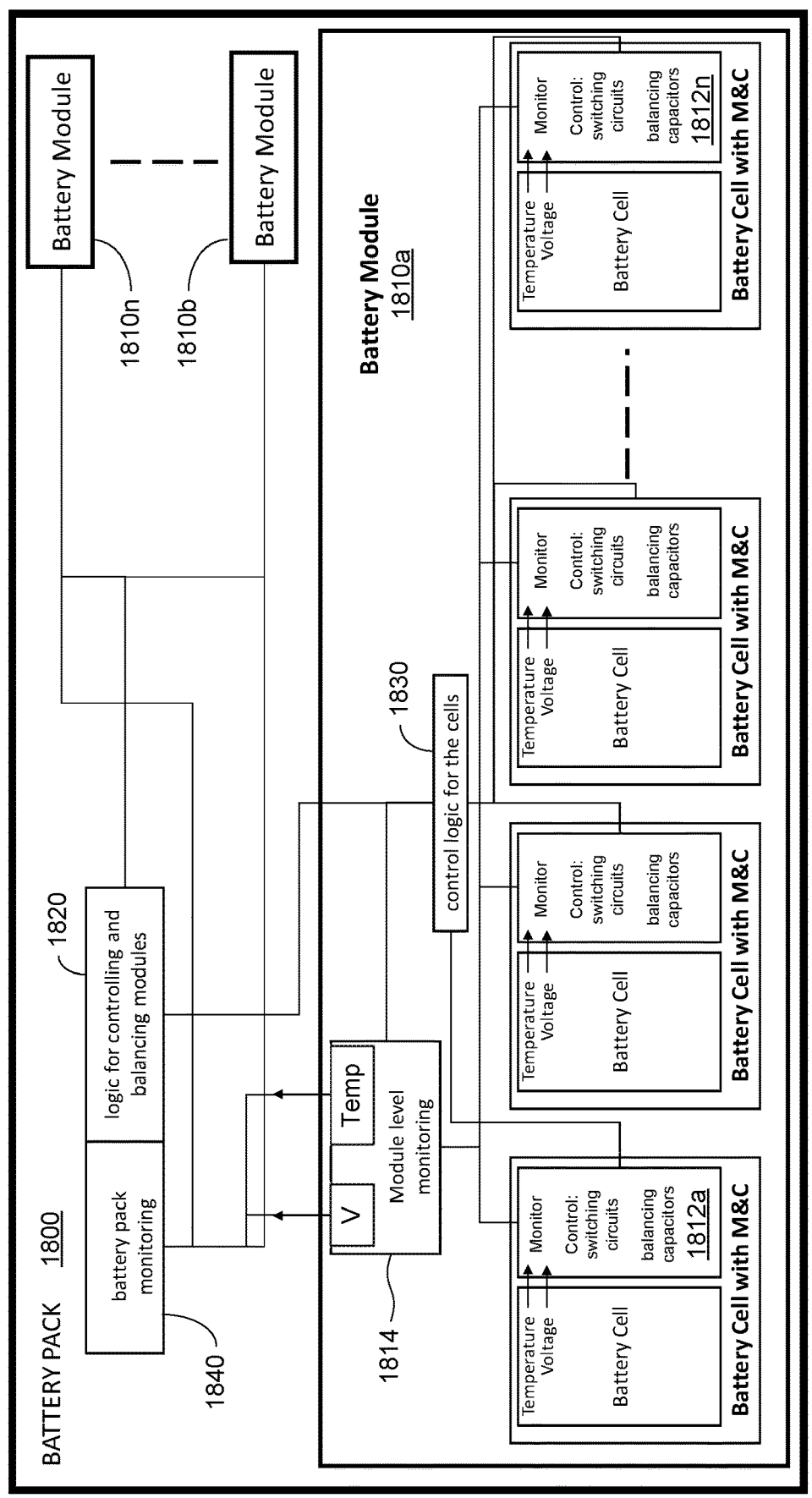
FIG. 21 is a diagram showing an exemplary battery pack, comprising a plurality of battery modules and a BMS configured to monitor and control the individual cells of each of the battery modules according to embodiments of the present invention.

FIG. 21 shows a complete battery pack 1800, comprising a plurality of battery modules 1810*a-n* and a BMS 1820-1840 configured to monitor and control the individual cells of each of the battery modules. A PIC 1812*a-n* in electrical communication with a corresponding cell (preferably packaged with an individual cell) monitors at least the voltage and temperature of the cell, and communicates the voltage and temperature information to an IC 1814 in the corresponding module that reports the voltage and temperature information for each cell (and optionally for the module as a whole) to a BMS circuit 1840 configured to collect, store and/or process the voltage and temperature information for all cells and (when applicable) modules in the battery pack. The BMS logic 1820 configured to control and balance the battery modules transmits control signals and optionally control information to each of the modules 1810*a-n*. Control logic 1830 within each module controls charge-balancing and (when applicable) switching operations in the charge-balancing circuitry within the module. Preferably, charge balancing is conducted at an individual cell level.

Figure 22:
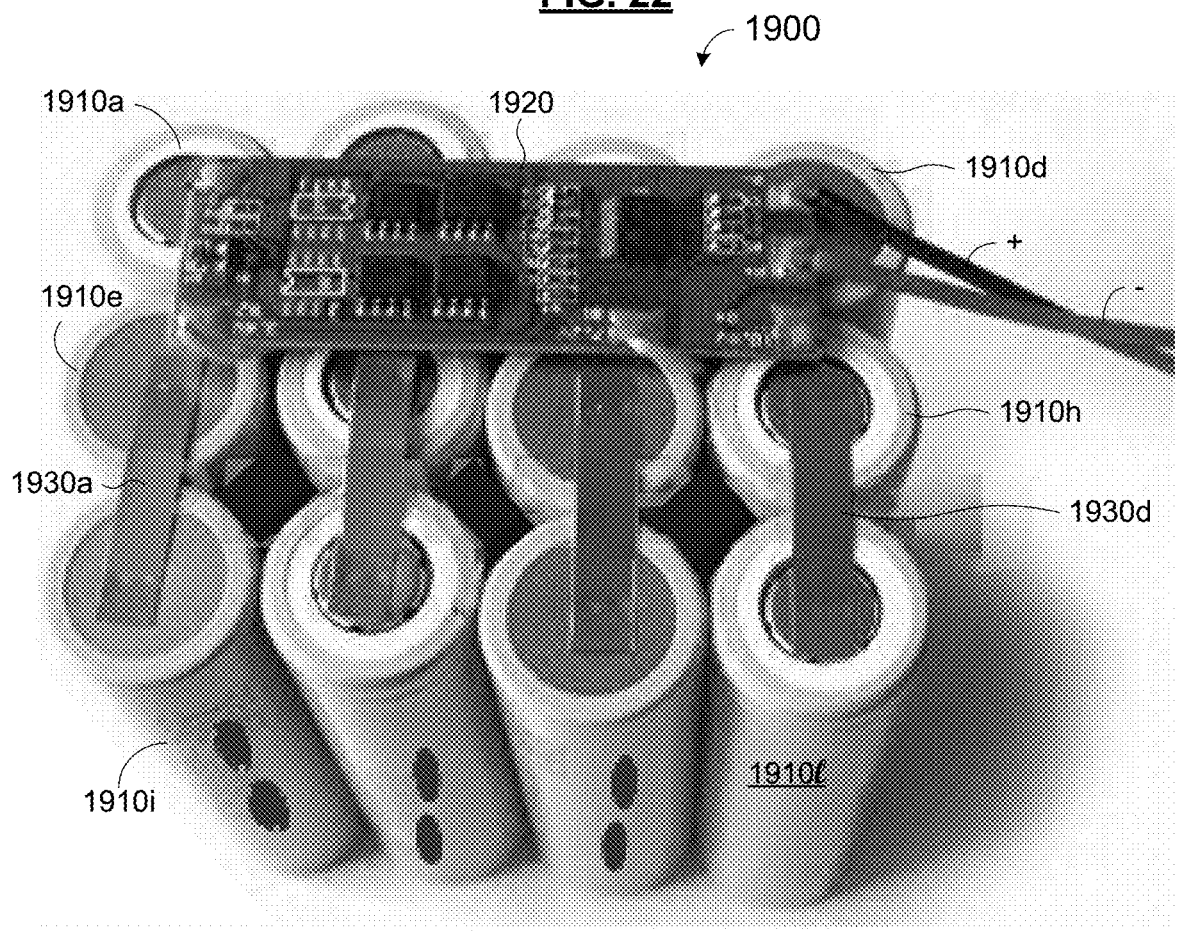
FIG. 22 is a diagram showing an exemplary battery pack with a PCB containing a BMS thereon that can be configured to monitor and control the individual cells of the battery according to embodiments of the present invention.
Figure 23:
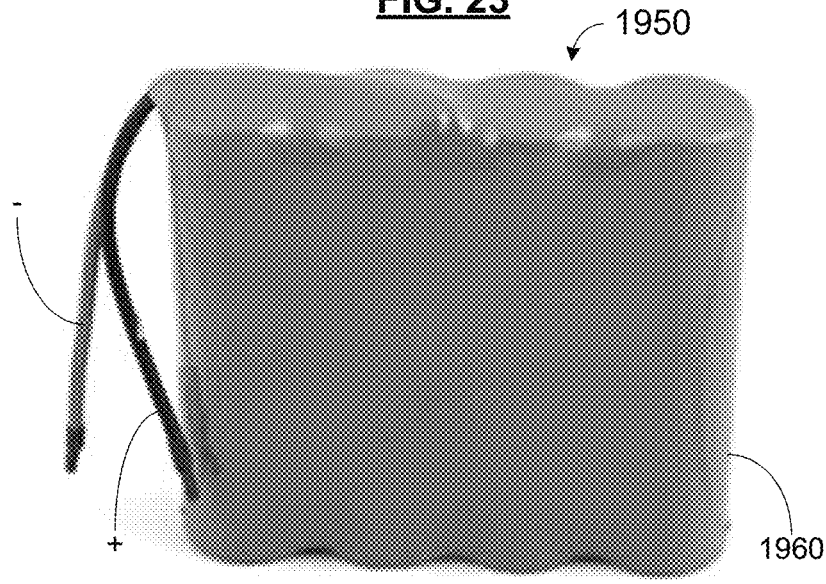
FIG. 23 is a diagram showing an exemplary battery module, comprising a plurality of battery cells and a BMS therein configured to monitor and control the individual cells of the battery module according to embodiments of the present invention.

FIG. 22 shows an exemplary battery pack 1900, without an outer casing or housing. The BMS for the battery pack 1900 is on the PCB 1920. A first level of PDPS or doped silicon-containing circuitry configured to monitor at least the voltage and temperature of a corresponding cell and transport charge into and out of the cell may be integrated into the cell cover (e.g., under the plastic outer casing surrounding each cell). Terminals for such circuitry may be located on the top of each of the cells, and control busses carrying the control signal(s) to the individual cells may be added as conductive (e.g., metal) lines substantially parallel to and insulated from the wide straps 1930*a-d* connecting the cells 1910*e-h* in the middle row to the corresponding cell 1910*i-l* in the nearest row. Such conductive lines are connected conventionally to the appropriate circuit(s) on the PCB 1920. At a module level, the PDPS or doped silicon circuitry is within the cover 1960 surrounding the battery cells 1950 in FIG. 23.

Figure 24:
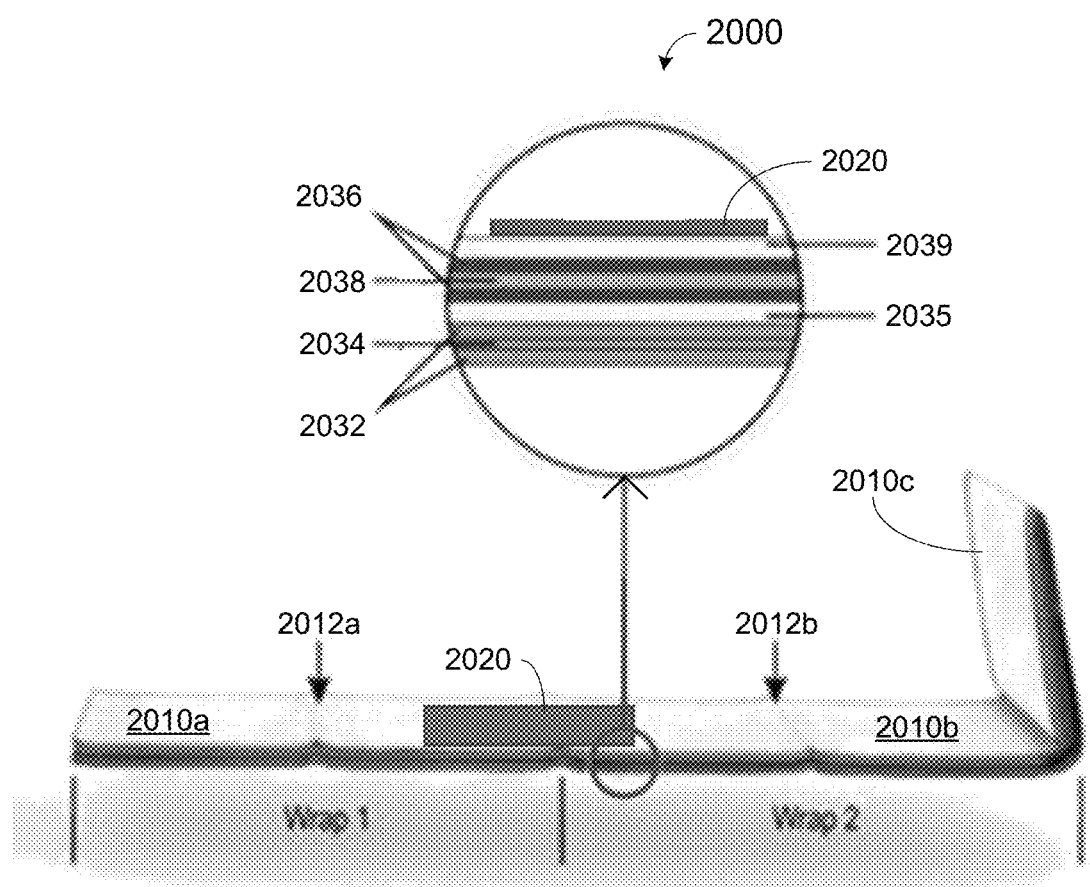
FIG. 24 is a diagram showing an exemplary folded battery cell, comprising a flex PCB and a plurality of functional battery layers, according to embodiments of the present invention.

Some battery cells may be folded, rather than rolled, usually to save space. In the case of a folded battery cell, the PDPS or doped silicon circuitry can be placed or formed so that it becomes an inner layer of the cell, as shown in FIG. 24. The flex PCB 2020 in FIG. 24 is shown as a rectangle bridging Wrap 1 2010*a* and Wrap 2 2010*b* of the unfolded battery 2000. A cross-section of the battery 2000 is shown in the circular call-out. The flex PCB 2020 with the PIC, the discrete components, and the traces thereon is the uppermost layer, on an inner separator layer 2039. The functional layers of the battery 2000 include one or more anode layers 2032 (e.g., carbon), a first current collector 2034 (e.g., copper or a copper foil), a center separator layer (e.g., comprising an electrolyte an a polymer gel or spacer), one or more cathode layers 2036 (e.g., lithium cobalt oxide), and a second current collector 2038 (e.g., aluminum or an aluminum foil). A lowermost anode layer 2032 and/or the first current collector 2034 may be mechanically supported (and chemically protected) by a polymeric sheet, which may be adapted to prevent or minimize ingress of oxygen and moisture. In some embodiments, the flex PCB 2020 can replace at least part of the inner separator layer 2039.

Figure 25:
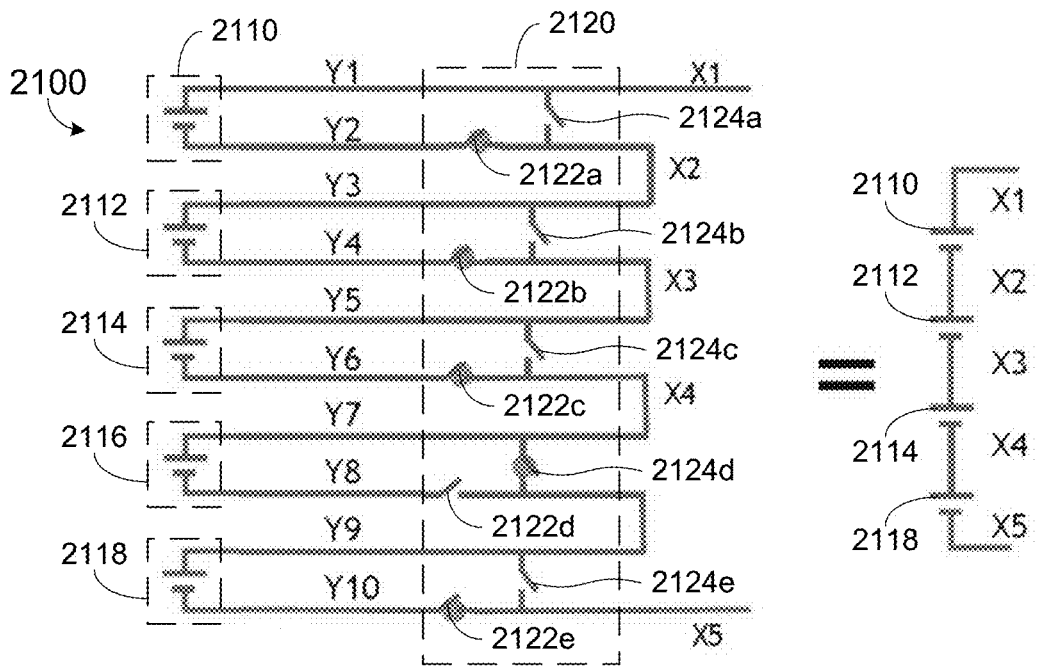
FIG. 25 is a diagram showing an exemplary battery, comprising a plurality of battery cells and a plurality of switches interconnecting the battery cells, according to one or more embodiments of the present invention.

FIG. 25 is a diagram showing an exemplary battery 2100, comprising a plurality of battery cells 2110-2118 and a plurality of switches 2122*a-e* and 2124*a-e*, interconnecting the battery cells 2110-2118, according to an embodiment of the present invention. Each of the battery cells 2110-2118 has two leads, wires or traces (e.g., Y1 and Y2, Y9 and Y10, etc.) extending from respective terminals of the cell. Corresponding to each battery cell 2110 through 2118 is a first switch 2122*a-e* configured to electrically connect or disconnect the two leads (e.g., Y1 and Y2) extending therefrom, and a second switch 2124*a-e* along one of the two leads (e.g., Y2, Y4, Y6, etc.) configured to electrically connect or disconnect one terminal (e.g., the negative terminal) of the battery cell from an adjacent battery cell, or in the case of the first or last battery cell (e.g., cell 2118), a corresponding terminal of the battery 2100, respectively.

In FIG. 25, switches 2122*a*, 2122*b*, 2122*c*, 2122*e* and 2124*d* are open, and switches 2122*d*, 2124*a*, 2124*b*, 2124*c* and 2124*e* are closed. This connects cells 2110, 2112, 2114 and 2118 in series (see the right-hand schematic in FIG. 25), and bypasses cell 2116 by short-circuiting leads Y7 and Y8 from the cell 2116 together. In the example shown in FIG. 25, switch 2116 may be defective, and is bypassed as a result. Of course, other cells can be bypassed for similar or different reasons, instead of or in addition to cell 2116. The number of cells in the exemplary battery 2100 can be less than (e.g., 3 or 4) or greater than (e.g., 6 or more) the number shown in the example of FIG. 25.

FIGS. 26A-E are diagrams showing exemplary "sea-of-cells" battery modules 2200 and 2200', comprising a plurality of battery cells 2210-2218 and one or more switch matrices 2220 and (optionally) 2240. The switch matrix 2220 is configured to interconnect the battery cells 2210-2218 to each other to realize the battery module 2200, and the switch matrix 2240 is configured to interconnect the battery cells 2210-2218 to an external component, such as the battery tester/analyzer 2230.

Figure 26A:
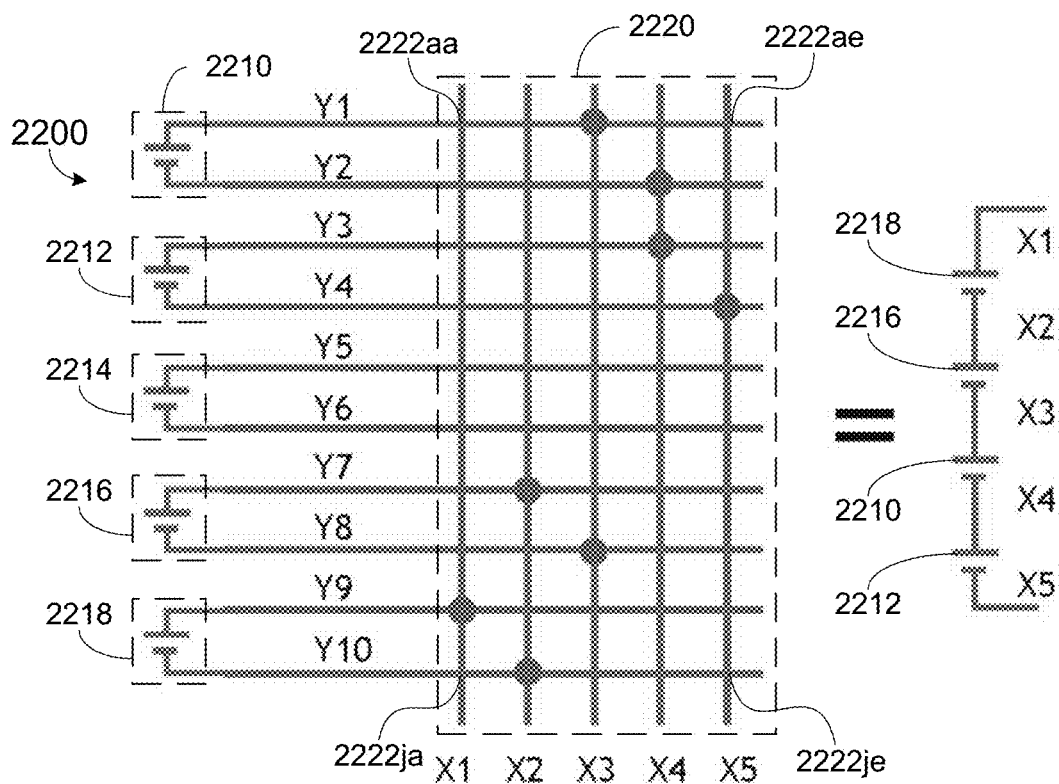
FIGS. 26A-E are diagrams showing exemplary "sea-of-cells" batteries, comprising a plurality of battery cells and one or more switch matrices configured to interconnect the battery cells to each other and/or to an external component (such as a tester/analyzer), according to embodiments of the present invention.

In the example shown in FIG. 26A, each of the battery cells 2210-2218 is connected to the switch matrix 2220 by two leads, wires or traces (e.g., Y1 and Y2, Y3 and Y4, Y9 and Y10, etc.) extending from respective terminals of the cell (e.g., "cell leads"). The switch matrix 2220 comprises a plurality of switches 2222*aa*-2222*je*, arranged in rows a-j and columns a-e. In general, the switch matrix 2220 includes n or (n+2) columns, 2n rows, and $2n^2$ or $2n*(n+2)$ switches, where n is the number of battery cells. However, the numbers of rows, columns and switches are not limited thereto (see, e.g., FIG. 26C), although if the number of rows is a value other than 2n, it is generally more than 2n.

In the example 2200 in FIG. 26A, the switch matrix 2220 includes five (5) leads, wires or traces X1-X5 (e.g., "cross-wires"). The leads, wires or traces X1 and X5 can function as terminals of the battery 2200 (see, e.g., the right-hand schematic in FIG. 26A), as long as one of X1 and X5 is connected to an odd-numbered Y lead, wire or trace (i.e., Y1, Y3, Y5, Y7 or Y9) and the other of X1 and X5 is connected to an even-numbered Y lead, wire or trace (i.e., Y2, Y4, Y6, Y8 or Y10), although the invention is not limited thereto. For example, any one of the leads, wires or traces X2-X4 can be substituted for either the lead, wire or trace X1 or X5 as a terminal of the battery 2200, as long as the same X lead, wire or trace is not connected to both an odd-numbered Y lead, wire or trace and an even-numbered Y lead, wire or trace. Alternatively, one of the leads, wires or traces Y1, Y3, Y5, Y7 or Y9 can function as the positive terminal of the battery 2200, and one of the leads, wires or traces Y2, Y4, Y6, Y8 or Y10 can function as the negative terminal of the battery 2200. Various arrangements of cells connected in series and/or in parallel can be easily imagined by those skilled in the art, although caution must be taken not to short-circuit two or more cells together. In essence, the cells 2201-2218 can be rearranged in any order to form a desired battery module.

In the switch matrix 2200 in FIG. 26A, switches 2222*ac*, 2222*bd*, 2222*cd*, 2222*de*, 2222*gb*, 2222*hc*, 2222*ia* and 2222*jb* are closed, and the remaining switches are open. The leads, wires or traces X1 and X5 (corresponding to terminals of the battery module 2200) are connected to only one of the leads, wires or traces Y1-Y10, and the leads, wires or traces X2, X3 and X4 are each connected to two of the leads, wires or traces Y1-Y10. Each of the leads, wires or traces Y1-Y10 is connected to only one of the leads, wires or traces X1 and X5. This effectively connects cells 2218, 2214, 2210 and 2212 in series, as shown in the right-hand schematic. Cell 2216 remains unconnected. Any extra/unconnected battery cells allow for redundancy in the system. Alternatively, to connect all of the cells in series, the switch matrix may have (n+2) columns and 2n*(n+2) switches.

Figure 26B:
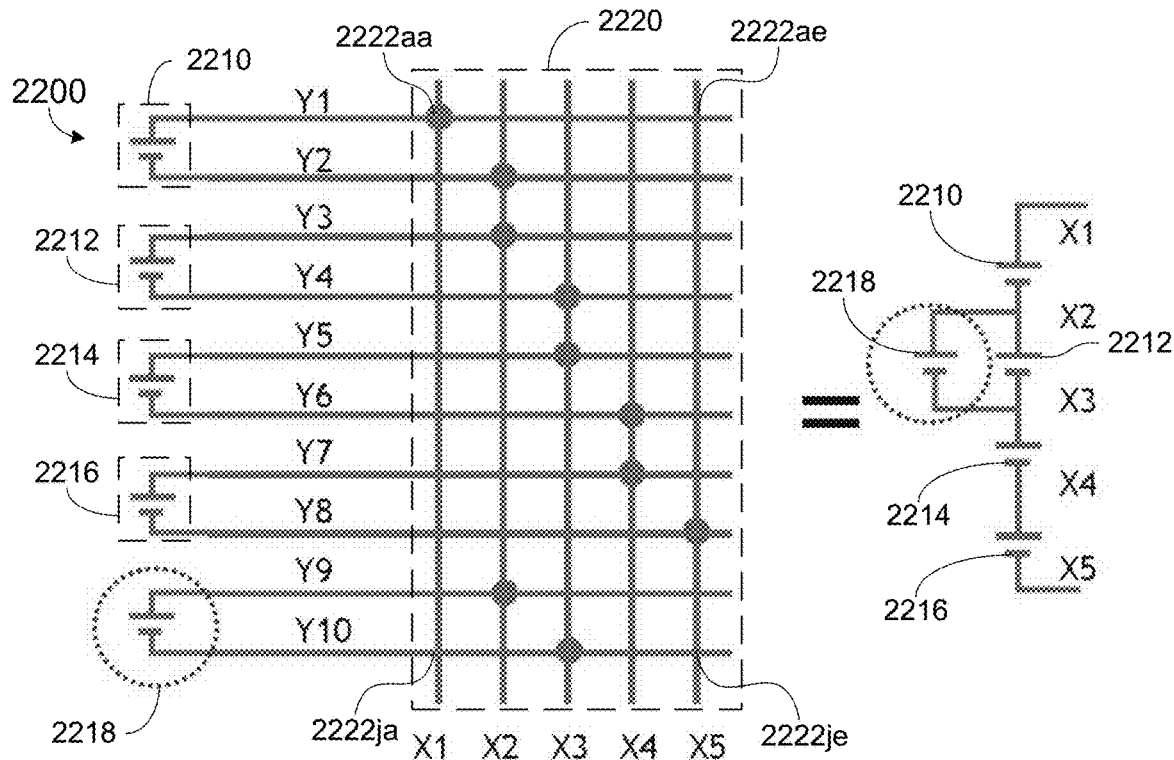

FIG. 26B shows the battery 2200 with the cell 2218 connected in parallel with the cell 2212 (see the right-hand schematic). Switches 2222*aa*, 2222*bb*, 2222*cb*, 2222*dc*, 2222*ec*, 2222*fd*, 2222*gd*, 2222*he*, 2222*ib* and 2222*jc* are closed, and the remaining switches are open. This effectively connects cells 2210, 2214 and 2216 in series, with cells 2212 and 2218 in parallel between cells 2210 and 2214. In this way, if cell 2212 is weak, a redundant cell 2218 can be coupled to the battery module 2200 in parallel with cell 2212 to support the weak cell 2212.

Figure 26C:
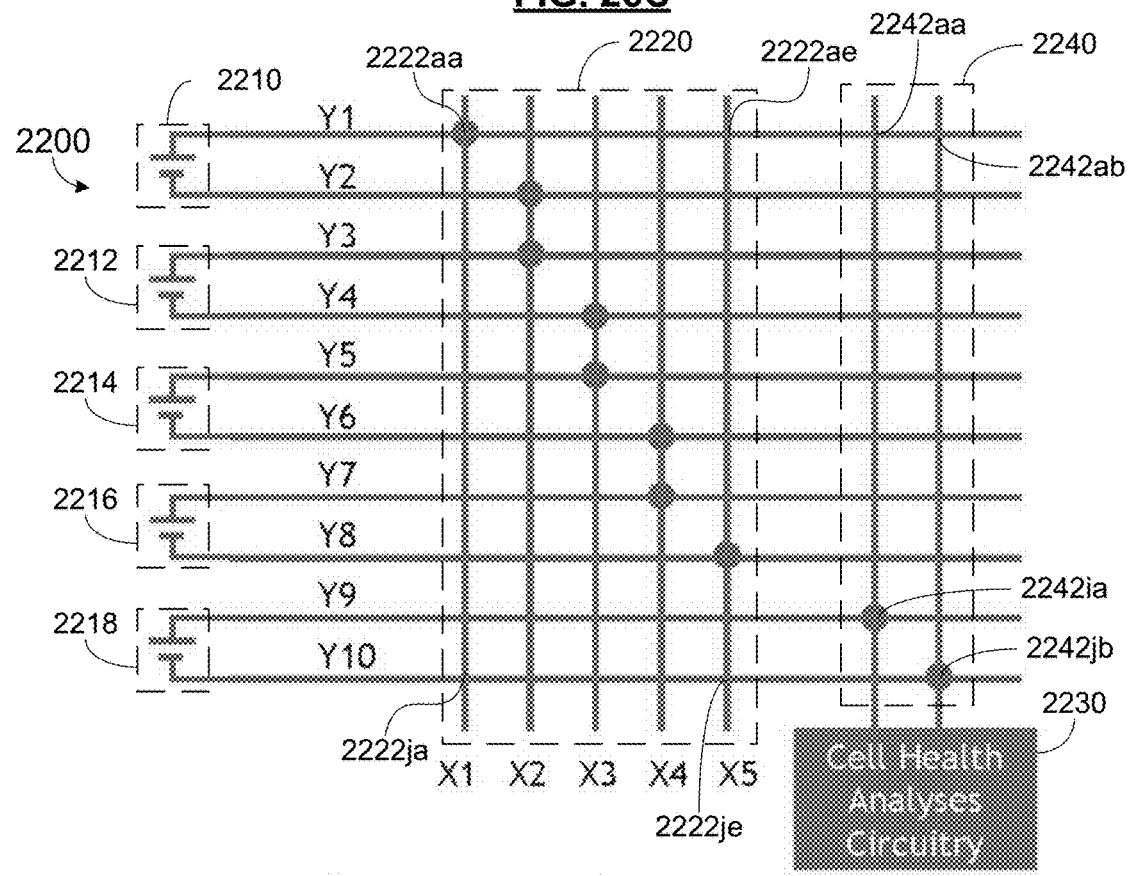

FIG. 26C shows an embodiment of a battery 2200' in which one of the cells (cell 2218) is connected to a battery tester/analyzer 2230 through a secondary switch matrix 2240. The secondary switch matrix 2240 comprises the same number of rows as the primary switch matrix 2220, two columns, and 4n switches 2242*aa*-2242*jb*. Alternatively, a number of columns or Y channels in the switch matrix as a whole can be reserved for external functionality, such as battery health checking.

The switch matrix 2240 allows the module 2200' to switch cells in and out during operation without any disturbance to the performance of the module 2200'. For example, if switches 2222*gd*, 2222*he*, 2242*ia* and 2242*jb* are opened, then switches 2222*id*, 2222*je*, 2242*ga* and 2242*hb* are closed, cell 2216 can be tested, and cell 2218 can be swapped into the battery cell series to maintain essentially the same battery module operation and performance.

Other circuits or electrical components, such as a display, a sensor, transmission circuitry, etc., can be connected to the battery 2200' through the secondary switch matrix 2240 instead of or in addition to the battery tester/analyzer 2230. Furthermore, instead of connecting an unconnected cell to the battery tester/analyzer 2230, the working battery (in the example of FIG. 26C, cells 2210, 2212, 2214 and 2216 connected in series) can be connected to the battery tester/analyzer 2230 (e.g., by closing switches 2242*aa* and 2242*hb*, and opening switches 2242*ia* and 2242*jb*).

Figure 26D:
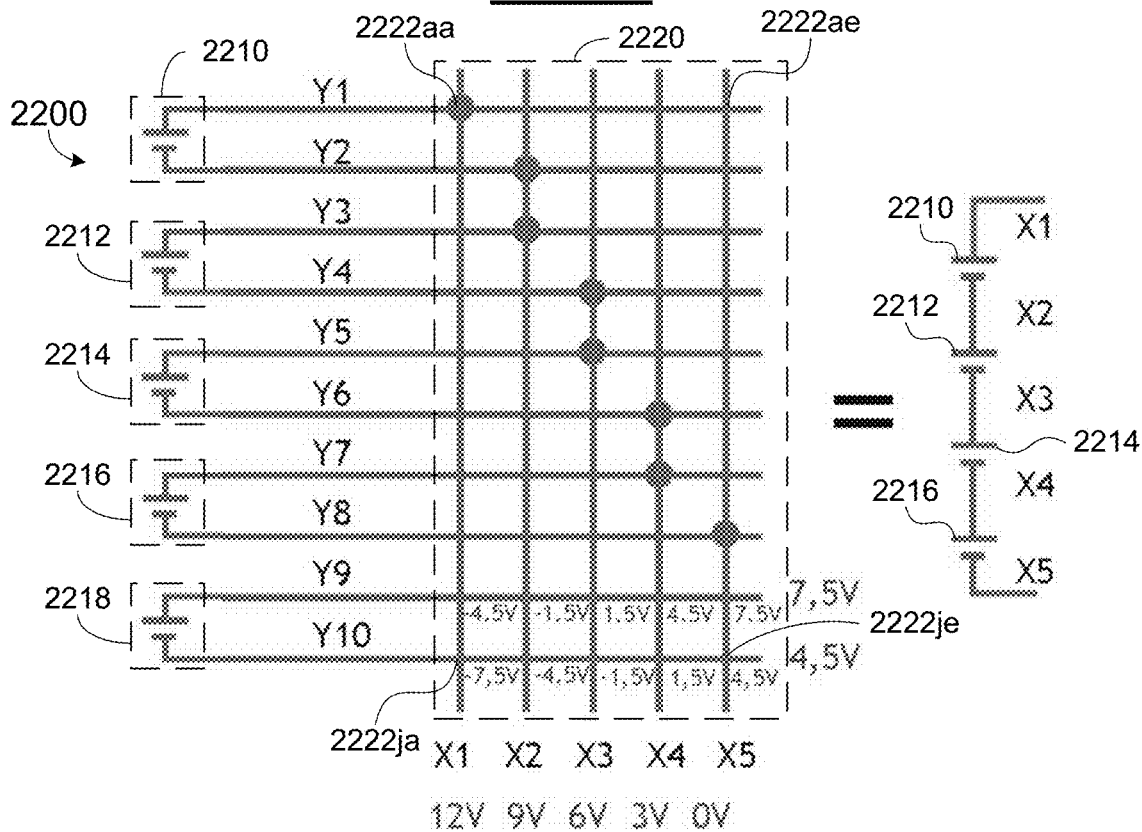

FIG. 26D shows the battery module 2200 with cells 2210, 2212, 2214 and 2216 connected in series (see the right-hand schematic). Each of the cells 2210-2218 provides a DC voltage of 3V, although the invention is not limited thereto. Below each of the leads, wires or traces X1-X5 is the voltage at or on the corresponding node in the right-hand schematic (i.e., 0V at X5, 3V at X4, 6V at X3, 9V at X2, and 12V at X1). The voltage over the switches in the matrix 2220 that are OFF varies, depending on the configuration of the rest of the matrix 2220. The switches in the matrix 2220 generally have a similar OFF impedance (e.g., $\geq 1$ Mohm). The potential on Y9 and Y10 is the average potential of X{1-5}, corrected for the cell voltage (in this case, 3V; see the voltages along Y9 and Y10 for each of the switches 2222*ia*-2222*je*). In this example, the maximum voltage on any of the switches 2222*ia*-2222*j*e (and thus, by extrapolation or extension on switches 2222*aa*-2222*he* when OFF) is ±7.5V.

Figure 26E:
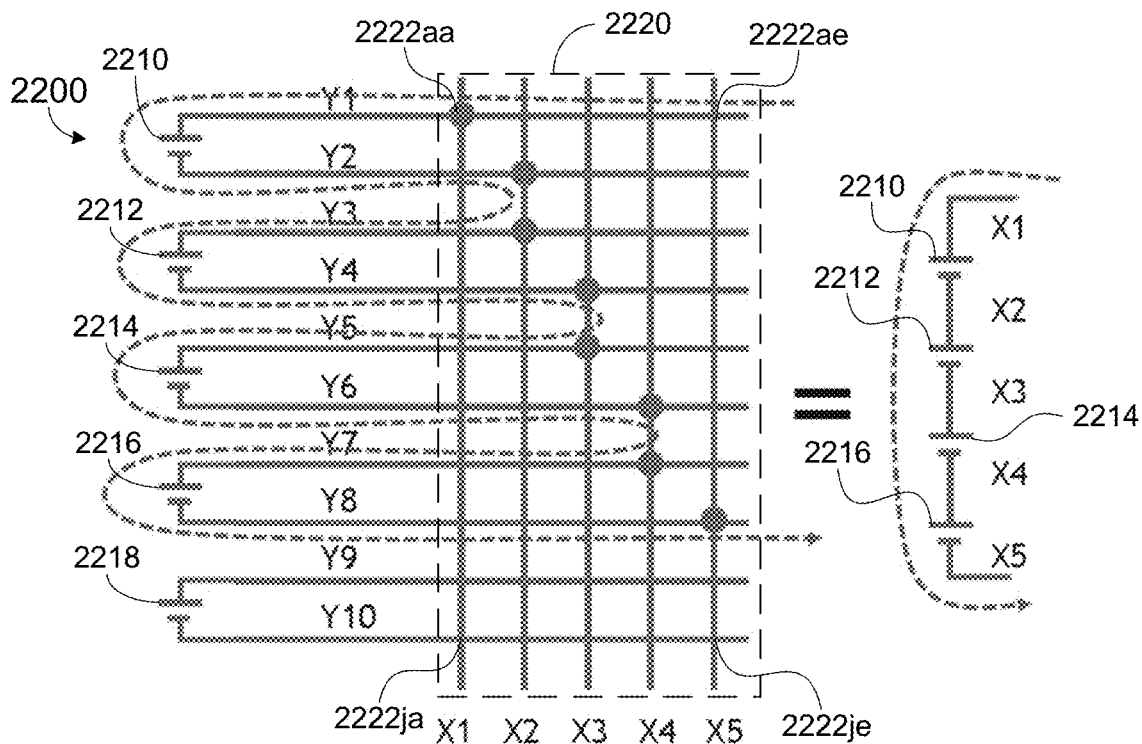

FIG. 26E shows the current path (by the curved, dashed arrow) through the battery module 2200, configured as shown in FIG. 26D. The module current passes through all active (i.e., ON or closed) switches in the matrix 2220. Assuming full flexibility in the matrix 2220, one cannot know in advance the direction in which the current will flow. Therefore, all switches 2222*aa*-2222*je* should be or comprise fully symmetric pass gates.

CONCLUSION/SUMMARY

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated.

What is claimed is:
1. A configurable battery, comprising:
    a) a plurality of battery cells, wherein each battery cell of the plurality of battery cells has:
        i) a first terminal and a second terminal, and
        ii) a first cell lead, wire or trace connected to the first terminal, and
        iii) a second cell lead, wire or trace connected to the second terminal;
    b) a switch matrix, configured to electrically connect the first terminal and the second terminal of said each battery cell of the plurality of battery cells to the first terminal or the second terminal of any other battery cell of the plurality of battery cells; and
    c) a plurality of cross leads, wires or traces crossing each of the first cell leads, wires or traces and each of the second cell leads, wires or traces, wherein:

the switch matrix comprises a switch at each location where one cross lead, wire or trace of the plurality of cross leads, wires or traces crosses one first cell lead, wire or trace of the first cell leads, wires or traces, or one second cell lead, wire or trace of the second cell leads, wires or traces, and each switch is configured to connect or disconnect the one cross lead, wire or trace to or from the one first cell lead, wire or trace or the second cell lead, wire or trace.

2. The configurable battery of claim 1, comprising n battery cells, 2n first and second cell leads, wires or traces, and n or more cross leads, wires or traces, n being an integer of at least four.

3. The configurable battery of claim 2, wherein the switch matrix comprises $2n^2$ switches, arranged in at least n columns and 2n rows, and or $2n*(n+2)$ switches.

4. The configurable battery of claim 3, wherein at most one of the switches in each row of the switch matrix connects said one first cell lead, wire or trace or said one second cell lead, wire or trace to said one cross lead, wire or trace.

5. The configurable battery of claim 2, wherein n is at least five.

6. The configurable battery of claim 1, wherein at least two of the cross leads, wires or traces are connected to an external component.

7. The configurable battery of claim 6, wherein the external component is a battery tester/analyzer, a display, a sensor, or transmission circuitry.

8. The configurable battery of claim 6, wherein the switch matrix comprises a first switch matrix configured to interconnect said each battery cell of the plurality of battery cells to at least one other battery cell of the plurality of battery cells, and a second switch matrix configured to interconnect the plurality of battery cells to the external component.

9. The configurable battery of claim 1, wherein first and second ones of the plurality of cross leads, wires or traces are connected to no more than one of the first and second cell leads, wires or traces, and each of the first and second cell leads, wires or traces is connected to no more than one of the plurality of cross leads, wires or traces.

10. The configurable battery of claim 9, wherein each of the remaining ones of the plurality of cross leads, wires or traces are connected to two or more of the first and second cell leads, wires or traces.

11. The configurable battery of claim 1, wherein:
a first cross lead, wire or trace of the plurality of cross leads, wires or traces is electrically connected only to one cell lead, wire or trace of the first cell leads, wires or traces,
a second cross lead, wire or trace of the plurality of cross leads, wires or traces is connected only to one cell lead, wire or trace of the second cell leads, wires or traces, and
each of the first cross lead, wire or trace and the second cross lead, wire or trace of the plurality of cross leads, wires or traces functions as a terminal of the configurable battery.

12. The configurable battery of claim 11, wherein at least two third cross leads, wires or traces of the plurality of cross leads, wires or traces are electrically connected to both (i) a second cell lead, wire or trace of the first cell leads, wires or traces other than the one cell lead, wire or trace of the first cell leads, wires or traces and (ii) a second cell lead, wire or trace of the second cell leads, wires or traces other than the one cell lead, wire or trace of the second cell leads, wires or traces.

13. The configurable battery of claim 12, wherein at least two battery cells of the plurality of battery cells are connected in series, and the switch matrix electrically connects:
a first cross lead, wire or trace of the plurality of cross leads, wires or traces only to one cell lead, wire or trace of the first cell leads, wires or traces, and
a second cross lead, wire or trace of the plurality of cross leads, wires or traces is connected only to one cell lead, wire or trace of the second cell leads, wires or traces.

14. The configurable battery of claim 13, wherein the switch matrix further electrically connects:
a plurality of third cross leads, wires or traces of the plurality of cross leads, wires or traces are electrically connected to both (i) a second cell lead, wire or trace of the first cell leads, wires or traces other than the one cell lead, wire or trace of the first cell leads, wires or traces and (ii) a second cell lead, wire or trace of the second cell leads, wires or traces other than the one cell lead, wire or trace of the second cell leads, wires or traces, and
each of the first leads, wires or traces and each of the second leads, wires or traces is electrically connected to at most one of the plurality of cross leads, wires or traces.

15. The configurable battery of claim 14, wherein each of the first leads, wires or traces and each of the second leads, wires or traces that is electrically connected to the one of the plurality of cross leads, wires or traces is electrically connected to a different cross lead, wire or trace from the other first leads, wires or traces and the other second leads, wires or traces.

16. The configurable battery of claim 1, wherein at least two battery cells of the plurality of battery cells are connected in parallel.

17. The configurable battery of claim 16, wherein the switch matrix electrically connects:
a first cross lead, wire or trace of the plurality of cross leads, wires or traces only to one cell lead, wire or trace of the first cell leads, wires or traces,
a second cross lead, wire or trace of the plurality of cross leads, wires or traces is connected only to one cell lead, wire or trace of the second cell leads, wires or traces,
a third cross lead, wire or trace of the plurality of cross leads, wires or traces is electrically connected to (i) at least two second cell leads, wires or traces of the first cell leads, wires or traces other than the one cell lead, wire or trace of the first cell leads, wires or traces and (ii) a second cell lead, wire or trace of the second cell leads, wires or traces other than the one cell lead, wire or trace of the second cell leads, wires or traces,
a fourth cross lead, wire or trace of the plurality of cross leads, wires or traces is electrically connected to (i) a second cell lead, wire or trace of the first cell leads, wires or traces other than the one cell lead, wire or trace of the first cell leads, wires or traces and (ii) at least two second cell leads, wires or traces of the second cell leads, wires or traces other than the one cell lead, wire or trace of the second cell leads, wires or traces, and
each of the first leads, wires or traces and each of the second leads, wires or traces is electrically connected to at most one of the plurality of cross leads, wires or traces.

18. The configurable battery of claim 1, wherein at least one battery cell of the plurality of battery cells is unconnected to other battery cells of the plurality of battery cells by the switch matrix.

19. The configurable battery of claim 1, wherein each of the switches in the switch matrix has an OFF impedance $\geq 1$ M$\Omega$.

20. The configurable battery of claim 1, wherein each of the switches in the switch matrix comprises a fully symmetric pass gate.

* * * * *